United States Patent
Simondet

(10) Patent No.: US 6,822,413 B2
(45) Date of Patent: Nov. 23, 2004

(54) SYSTEMS AND METHODS INCORPORATING AN END EFFECTOR WITH A ROTATABLE AND/OR PIVOTABLE BODY AND/OR AN OPTICAL SENSOR HAVING A LIGHT PATH THAT EXTENDS ALONG A LENGTH OF THE END EFFECTOR

(75) Inventor: Sean D. Simondet, Shakopee, MN (US)

(73) Assignee: FSI International, Inc., Chaska, MN (US)

(*) Notice: Subject to any disclaimer, the term of this patent is extended or adjusted under 35 U.S.C. 154(b) by 53 days.

(21) Appl. No.: 10/391,306

(22) Filed: Mar. 18, 2003

(65) Prior Publication Data

US 2004/0012363 A1 Jan. 22, 2004

Related U.S. Application Data

(60) Provisional application No. 60/366,372, filed on Mar. 20, 2002.

(51) Int. Cl.[7] .............................................. B25J 15/02
(52) U.S. Cl. ................... 318/568.21; 318/567; 318/640
(58) Field of Search .............................. 318/568.4, 567, 318/640; 901/30, 46; 414/744.5

(56) References Cited

U.S. PATENT DOCUMENTS

| | | |
|---|---|---|
| 4,493,606 A | 1/1985 | Foulke et al. |
| 4,511,985 A | 4/1985 | Inaba et al. |
| 4,586,743 A | 5/1986 | Edwards et al. |
| 4,632,632 A | 12/1986 | Simone |
| 4,813,732 A | 3/1989 | Klem |
| 4,895,486 A | 1/1990 | Baker et al. |
| 4,952,299 A | 8/1990 | Chrisos et al. |
| 4,957,320 A | 9/1990 | Ulrich |
| 4,986,729 A | 1/1991 | Ohlenbusch |
| 5,022,695 A | 6/1991 | Ayers |
| 5,044,752 A | 9/1991 | Thurfjell et al. |
| 5,108,140 A | 4/1992 | Bartholet |
| 5,125,790 A | 6/1992 | Foulke et al. |
| 5,133,635 A | 7/1992 | Malin et al. |
| 5,239,182 A | 8/1993 | Tateyama et al. |
| 5,280,981 A | 1/1994 | Schulz |
| 5,378,033 A | 1/1995 | Guo et al. |

(List continued on next page.)

FOREIGN PATENT DOCUMENTS

| | | |
|---|---|---|
| EP | 0 820 091 A2 | 1/1998 |
| EP | 1 137 052 A1 | 9/2001 |
| WO | WO 92/05920 A1 | 4/1992 |
| WO | WO 94/19821 A1 | 9/1994 |
| WO | WO 98/02910 A1 | 1/1998 |
| WO | WO 99/02996 A2 | 1/1999 |
| WO | WO 99/62107 A1 | 12/1999 |
| WO | WO 00/02808 A1 | 1/2000 |
| WO | WO 00/03418 A2 | 1/2000 |
| WO | WO 00/22589 A1 | 4/2000 |
| WO | WO 00/33359 A2 | 6/2000 |
| WO | WO 01/69336 A1 | 9/2001 |
| WO | WO 01/83171 A1 | 11/2001 |
| WO | WO 01/96884 A1 | 12/2001 |
| WO | WO 03/008157 A2 | 1/2003 |

*Primary Examiner*—Karen Masih
(74) *Attorney, Agent, or Firm*—Kagan Binder, PLLC

(57) ABSTRACT

Robot system incorporates a versatile end effector that can be used to transport wafers, map wafers, and autocalibrate the movements of the robotic system. Typically, the end effector of the invention is rotatably and/or pivotably coupled to a robotic arm and includes an optical sensor system whose light path preferably includes a directional component that extends along a lengthwise axis of the end effector. Preferably the end effector is independently movable about at least two axes. These characteristics, singly or in combination, allow the end effector to carry out transport, mapping, and autocalibration functions within a relatively small volume either horizontally, vertically, or at other desired orientations.

23 Claims, 20 Drawing Sheets

U.S. PATENT DOCUMENTS

| | | | |
|---|---|---|---|
| 5,378,317 A | 1/1995 | Kashiwase et al. | |
| 5,466,945 A | 11/1995 | Brickell et al. | |
| 5,501,498 A | 3/1996 | Ulrich | |
| 5,504,345 A | 4/1996 | Bartunek et al. | |
| 5,539,323 A | 7/1996 | Davis, Jr. | |
| 5,741,113 A | 4/1998 | Bacchi et al. | |
| 5,765,444 A | 6/1998 | Bacchi et al. | |
| 5,772,597 A * | 6/1998 | Goldberger et al. | 600/473 |
| 5,822,498 A | 10/1998 | Kumasaka et al. | |
| 5,870,488 A | 2/1999 | Rush et al. | |
| 5,906,469 A | 5/1999 | Oka et al. | |
| 5,944,476 A | 8/1999 | Bacchi et al. | |
| 5,980,188 A | 11/1999 | Ko et al. | |
| 5,988,971 A | 11/1999 | Fossey et al. | |
| 6,013,920 A | 1/2000 | Gordon et al. | |
| 6,037,733 A | 3/2000 | Genov et al. | |
| 6,075,334 A | 6/2000 | Sagues et al. | |
| 6,092,971 A | 7/2000 | Balg et al. | |
| 6,099,059 A | 8/2000 | Schultz et al. | |
| 6,167,322 A | 12/2000 | Holbrooks | |
| 6,211,514 B1 | 4/2001 | Schultz et al. | |
| 6,242,879 B1 | 6/2001 | Sagues et al. | |
| 6,256,555 B1 | 7/2001 | Bacchi et al. | |
| 6,275,748 B1 | 8/2001 | Bacchi et al. | |
| 6,285,920 B1 | 9/2001 | McGee et al. | |
| 6,298,280 B1 | 10/2001 | Bonora et al. | |
| 6,304,051 B1 | 10/2001 | Sagues et al. | |
| 6,318,951 B1 | 11/2001 | Schmidt et al. | |
| 6,322,119 B1 | 11/2001 | Schmidt et al. | |
| 6,323,616 B1 | 11/2001 | Sagues et al. | |
| 6,360,144 B1 | 3/2002 | Bacchi et al. | |
| 6,366,830 B2 | 4/2002 | Bacchi et al. | |
| 6,403,945 B2 | 6/2002 | Roessler et al. | |
| 6,435,807 B1 | 8/2002 | Todorov et al. | |
| 6,438,460 B1 | 8/2002 | Bacchi et al. | |
| 6,453,214 B1 | 9/2002 | Bacchi et al. | |
| 6,532,403 B2 | 3/2003 | Beckhart et al. | |
| 6,618,645 B2 | 9/2003 | Bacchi et al. | |
| 2003/0035711 A1 * | 2/2003 | Gilchrist | 414/744.5 |
| 2003/0052497 A1 | 3/2003 | Holbrooks | |
| 2003/0091410 A1 | 5/2003 | Larson et al. | |

* cited by examiner

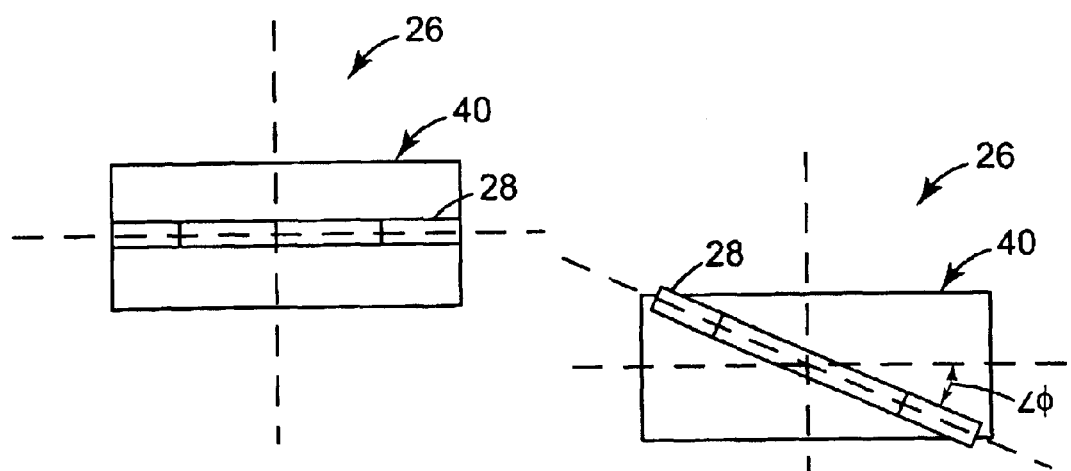
Fig. 4a
Fig. 4b
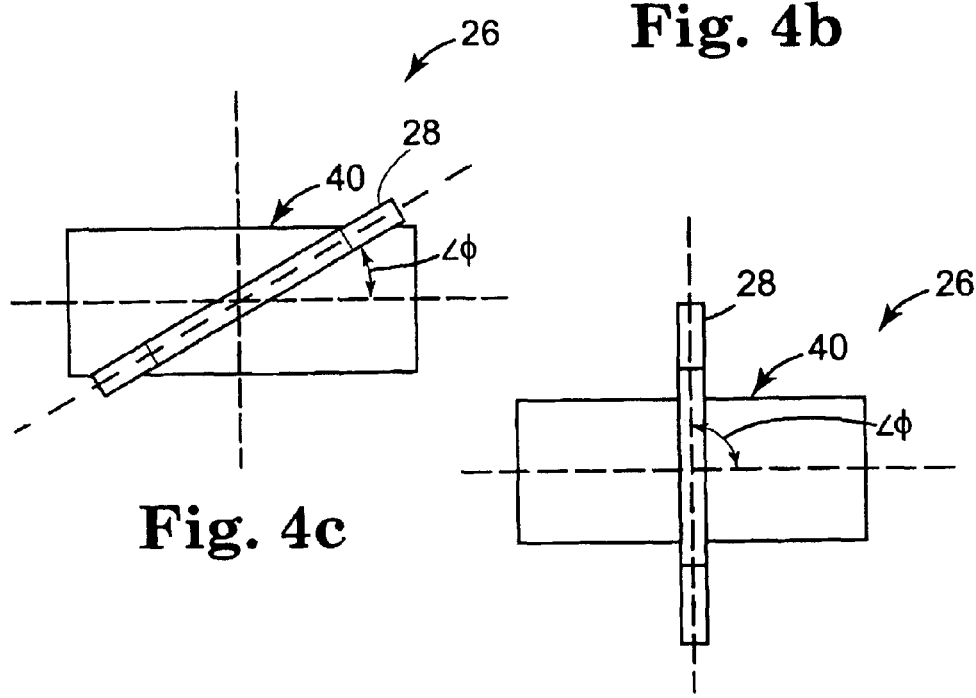
Fig. 4c
Fig. 4d

SYSTEMS AND METHODS INCORPORATING AN END EFFECTOR WITH A ROTATABLE AND/OR PIVOTABLE BODY AND/OR AN OPTICAL SENSOR HAVING A LIGHT PATH THAT EXTENDS ALONG A LENGTH OF THE END EFFECTOR

CROSS-REFERENCE TO RELATED APPLICATIONS

The present non-provisional Application claims the benefit of commonly assigned provisional Application having serial No. 60/366,372, filed on Mar. 20, 2002, and entitled SYSTEMS AND METHODS INCORPORATING AN END EFFECTOR WITH A ROTATABLE AND/OR PIVOTABLE BODY AND/OR AN OPTICAL SENSOR HAVING A LIGHT PATH THAT EXTENDS ALONG A LENGTH OF THE END EFFECTOR, which Application is incorporated herein by reference in its entirety.

FIELD OF THE INVENTION

The present invention relates to robotic systems for handling wafers in which an end effector is used to grip a wafer. More specifically, this invention relates to such systems wherein the end effector incorporates transporting and sensing capability for mapping wafers, automated calibrating of a robot to accurately position or move itself to carry out desired robotic operations, and the like.

BACKGROUND OF THE INVENTION

Microelectronic devices (e.g., integrated circuits, flat panel displays, thin film heads for computer disk drives, micromechanical machine devices, and the like), often are produced from wafers of semiconductor material. During the course of manufacture, the wafers, which may bear one or more partially formed devices depending upon the stage of manufacture, are typically housed in wafer holding structures, or the like. Such holding structures typically include a plurality of closely spaced apart slots, for holding a wafer. Depending upon the kind of holding structure, batches of the wafers may be held in a particular orientation, including horizontally or vertically. Holding structures may be used to transfer one or more wafers between tools in a fabrication facility. Other kinds of holding structures may be used to transfer one or more wafers among locales within a tool or tool cluster. Still others may be used to hold wafers during a manufacturing procedure.

Various types of wafer handling devices are known for transporting wafers to and from wafer holding structures. Many use a robotic arm having a gripping member that can hold or otherwise grip a wafer. The gripping member often is referred to as an end effector. The end effector typically enters the holding structure through a narrow gap between a pair of adjacent wafers to retrieve or replace a wafer. The end effector generally is thin, rigid, and positionable with high accuracy to fit between the closely spaced apart wafers in a holding structure.

Wafers of semiconductor material are supplied in many sizes. Conventionally, wafers having a diameter of 200 millimeters ("mm") have been used widely in the manufacture of microelectronic devices. More recently, semiconductor production systems have used 300 mm diameter wafers, with even larger diameter wafers under consideration as well. Regardless of the size, it may be desirable for a particular end effector to be able to hold wafers in different orientations, e.g., vertically as well as horizontally. For example, assignee's copending U.S. Provisional Patent Application Serial No. 60/338,057 filed Nov. 13, 2001, for REDUCED FOOTPRINT TOOL WITH AUTOMATED PROCESSING OF MICROELECTRONIC SUBSTRATES, and bearing attorney docket no. FSI0080/P1, describes a low footprint tool in which a wafer transfer robot removes horizontal wafers from an industry standard front opening unified pod ("FOUP"), flips the wafers from a horizontal to a vertical orientation, and then stores them vertically in a holding structure for processing. It would be desirable to provide an improved end effector design that provides this transport capability.

In-process semiconductor wafers are quite valuable. It is not uncommon for an in-process semiconductor wafer bearing a plurality of partially formed devices to have a value that exceeds several hundred thousand dollars or more per wafer or batch. It is important, therefore, to handle such wafers carefully to avoid breaking or otherwise damaging them. One step in which in-process wafers are susceptible to damage is during transport to and from a wafer holder. To minimize the risk of damage during such transport, it is common in the industry to electrically, optically, and/or otherwise scan a holder with appropriate sensors to determine the presence and/or absence of wafers, correct orientation of wafers stored in the holder, location of wafers and/or open storage positions, and/or other characteristics of the holder. Such scanning is generally referred to as "wafer mapping" or "mapping".

Sensors to carry out mapping have been incorporated into an end effector. U.S. Pat. No. 6,256,555, for example, describes an end effector with an integrated mapping capability. A fiber optic system is located at the tip of the end effector to provide a light path. The end effector tip is positioned proximal to the wafers, and then the end effector traverses up and/or down in front of the wafers to carry out mapping. Wafer location, presence, and orientation is determined by breaking of the light path. Another commercially available end effector includes a sensor, commercially available under the trademark "HAMA," at the backside of the end effector to carry out mapping. This approach also allows horizontal wafers to be mapped by rotating the end effector around about a vertical axis so that the sensor faces the wafers to be mapped. In this position, the end effector traverses up and/or down in front of the wafers to carry out mapping.

Both of these conventional mapping approaches may be able to map horizontal wafers acceptably, but neither is able to map wafers in other orientations (e.g., vertical orientations) due to limitations of the sensor, limitations in the robot motion, limitations of the end effector motion, and/or limited volume within which the robot arm is allowed to move. It would be desirable to provide a system with mapping capability that can map wafers in a wide variety of orientations, e.g., horizontal and/or vertical, as desired.

Another aspect of various wafer handling devices is calibration or "teaching" a robot to move among and/or accurately position itself at a plurality of pre-selected positions. As mentioned above, in the fabrication of semiconductors, wafers are typically held in a wafer holding structure and then transferred to various pre-programmed processing locations by a robotic wafer handling system. In order to transfer such wafers, it is preferred that the robot have precise knowledge of spatial coordinates (e.g., x, y, z, r, θ, etc.) of a wafer at a variety of locations. A robot control system preferably provides the aforesaid knowledge to position the robot arm and end effector to releasably engage or disengage a wafer within a wafer holding structure.

After a tool is set up for the first time, serviced, upgraded, or modified, it is often desirable to teach, or re-teach as the case may be, the robot(s) in the tool the precise spatial coordinates as to location and dimensions of tool components to allow the robot to move rapidly among locales without collision.

Generally, such calibration or teaching involves using sensing mechanism(s) for the robot to sense spatial features of objects (e.g., wafer holding structures, tool boundaries, etc.) in its environment and establish spatial relationships between the robot and such objects. See, e.g., U.S. Pat. No. 5,822,498, which describes a manual method of calibration.

Calibration of a robot can occur not just manually with the help of an operator but also automatically by the robot itself. Manual calibration is less preferred due to time and safety concerns. Time requirements of manual calibration may be relatively high because an operator manually jogs the robot arm around to help determine spatial coordinates. Safety can be a concern for operators in manual calibration because of the force such robots can generate. In either case, teaching typically occurs with the help of sensing mechanism(s) on the robot and/or sensing mechanism(s) distributed around the robot's operating environment. In some instances, sensing mechanism(s)s used to calibrate a robot have been integrated into robot end effectors. See, e.g., U.S. Pat. No. 6,075,335, which describes an automated approach for calibrating a robot. However, this and similar calibration methodologies do not rely solely or even primarily on an sensing mechanism(s) integrated within an end effector due to factors including limitations of the sensing mechanism(s), limitations in the robot motion, limitations in the end effector motion, and/or limited volume within which the robot arm is allowed to move. It would be desirable to provide robotic systems in which a robotic end effector includes a sensing mechanism(s) to carry out substantial aspects, if not the entirety, of an automated robot calibration methodology with enhanced motility in confined volumes.

SUMMARY OF THE INVENTION

The present invention relates to equipment and methods for manufacturing wafer or disk shaped materials, specifically including microelectronic devices, and specifically including semiconductor wafers. The invention specifically contemplates a robot system incorporating a versatile end effector that can be used to transport wafers, map wafers, and autocalibrate the movements of the robotic system. Typically, the end effector of the invention is rotatably and/or pivotably coupled to a robotic arm and includes an optical sensor system whose light path preferably includes a directional component that extends along a lengthwise axis of the end effector. Preferably, the end effector is independently moveable about at least two axes. These characteristics, singly or in combination, allow the end effector to carry out transport, mapping, and autocalibration functions within a relatively small volume and in a variety of orientations, including vertical and/or horizontal orientations and/or other desired orientations.

The end effector of the invention can be used for mapping wafers in a variety of orientations, including vertical and horizontal orientations, with efficiency of space. In general, the end effector can be used to map wafers in any orientation by positioning the end effector in an orientation so that its lengthwise edge incorporating the sensor system is proximal to the wafers and then moving the end effector through an axis that preferably is substantially perpendicular to the plane of the wafers so that the wafers can interrupt the light path.

The phrase "substantially perpendicular" as used with respect to an end effector of the present invention moving in an axis relative to a plane of wafers so the wafers can interrupt the light path preferably means that an end effector of the present invention may traverse (i.e., map) a wafer(s) along one or more axes that form an angle with a main plane of the wafer(s) such that the end effector will not contact the wafer(s) during such traversing. In one preferred embodiment, such an axis may form an angle to a main plane of the wafer(s) of 90 degrees, optionally, plus or minus an angle in the range from 0 degrees to about 10 degrees, preferably in the range from 0 degrees to about 5 degrees, and more preferably in the range from 0 degrees to about 1 degree. During mapping, the main plane of the end effector may be disposed parallel or at an angle relative to the main plane of the items being mapped. Typically, the main plane of end effector 26 in the Figures is substantially parallel to the main plane of the items being mapped.

For example, the end effector can be used to map horizontal wafers by positioning the main plane of the end effector in a generally horizontal orientation so that its lengthwise edge incorporating the sensor system is proximal to the wafers. The end effector may then be moved along a linear, acruate, and/or other suitable axis that is substantially perpendicular to a main plane of the wafers so that the wafers can interrupt the light path. In another example, the end effector can be used to map vertical wafers by positioning the main plane of the end effector in a generally vertical orientation so that its lengthwise edge incorporating the sensor system is proximal to the wafers. The end effector may then be moved along a linear, arcuate, and/or other suitable axis that is substantially perpendicular to a main plane of the wafers so that the light path can be interrupted by the wafers. In this orientation for mapping vertical wafers, the end effector may be positioned above the vertical wafers in a reduced amount of headspace above the vertical wafers, e.g., a headspace having a height not much greater than the width of the inventive end effector.

Various exemplary embodiments of the present invention are described in the following specification and claims and drawings attached hereto.

BRIEF DESCRIPTION OF THE DRAWINGS

The above mentioned and other advantages of the present invention, and the manner of attaining them, will become more apparent and the invention itself will be better understood by reference to the following description of the exemplary embodiments of the invention taken in conjunction with the accompanying drawings, wherein:

FIG. 4a is an end view of the end effector and coupling mechanism incorporated into the robot system of FIG. 1, wherein the end effector is oriented with its main plane horizontal, e.g., rotated at an angle Φ of 0° relative to the horizontal;

FIG. 4b is an end view of the end effector and coupling mechanism incorporated into the robot system of FIG. 1, wherein the end effector is oriented with its main plane rotated clockwise at an angle Φ of about +30 degrees relative to the horizontal;

FIG. 4c is an end view of the end effector and coupling mechanism incorporated into the robot system of FIG. 1, wherein the end effector is oriented with its main plane rotated counterclockwise at an angle Φ of about −30 degrees relative to the horizontal;

FIG. 4d is an end view of the end effector and coupling mechanism incorporated into the robot system of FIG. 1, wherein the end effector is oriented with its main plane rotated counterclockwise at an angle Φ of about −90 degrees relative to the horizontal;

FIG. 7b is a schematic perspective view showing the end effector of FIG. 1 being used to map the wafers in the FOUP of FIG. 7a;

FIG. 8b is a schematic perspective view showing the end effector of FIG. 1 being used to map the wafers in the wafer holding structure of FIG. 8a;

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

Figure 1:
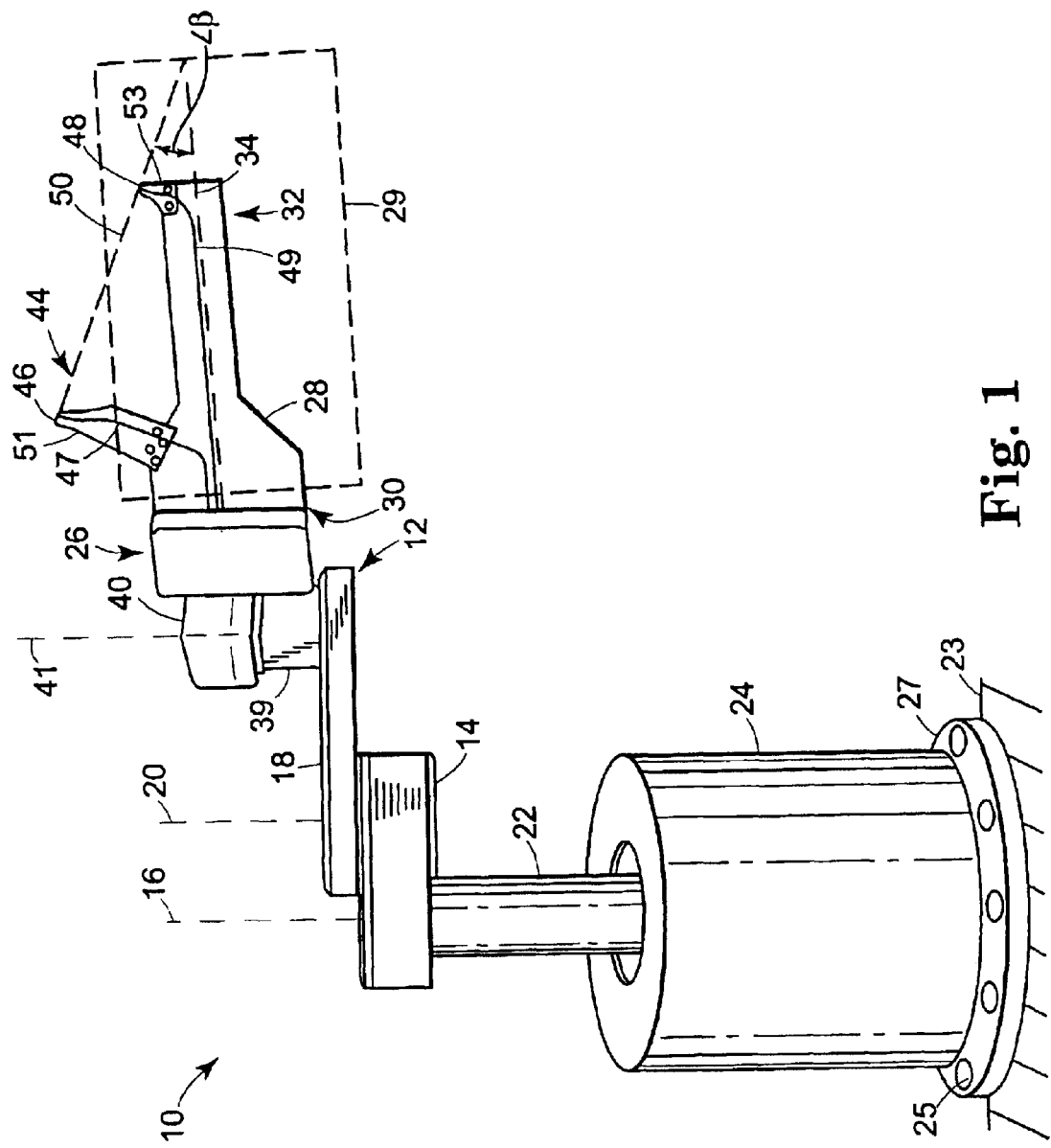
FIG. 1 is a schematic, perspective view of a robot system of the present invention, wherein the body of the end effector is in substantially vertical orientation.
Figure 2:
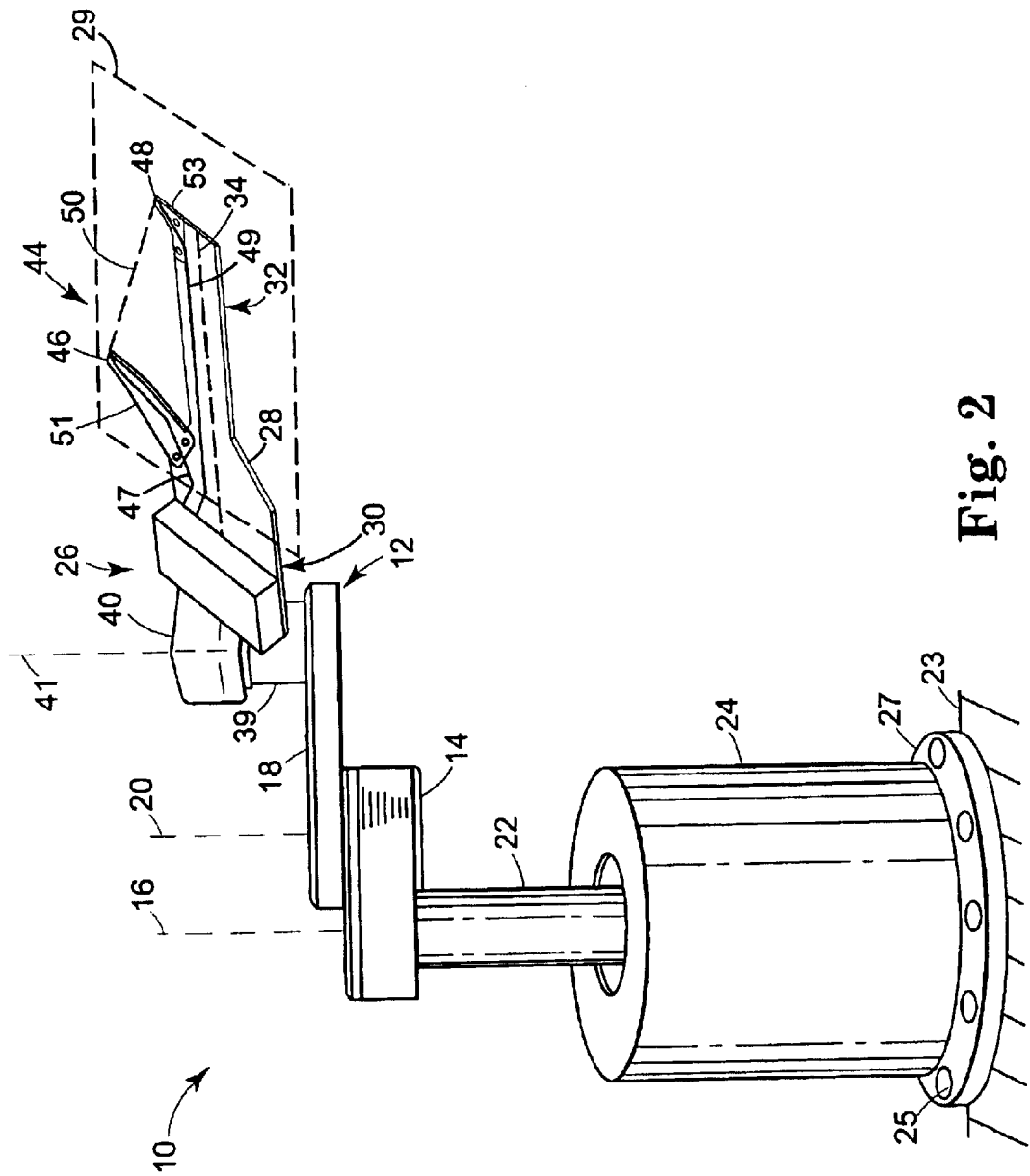
FIG. 2 is a schematic, perspective view of a robot system of the present invention, wherein the body of the end effector is in a diagonal orientation.
Figure 3:
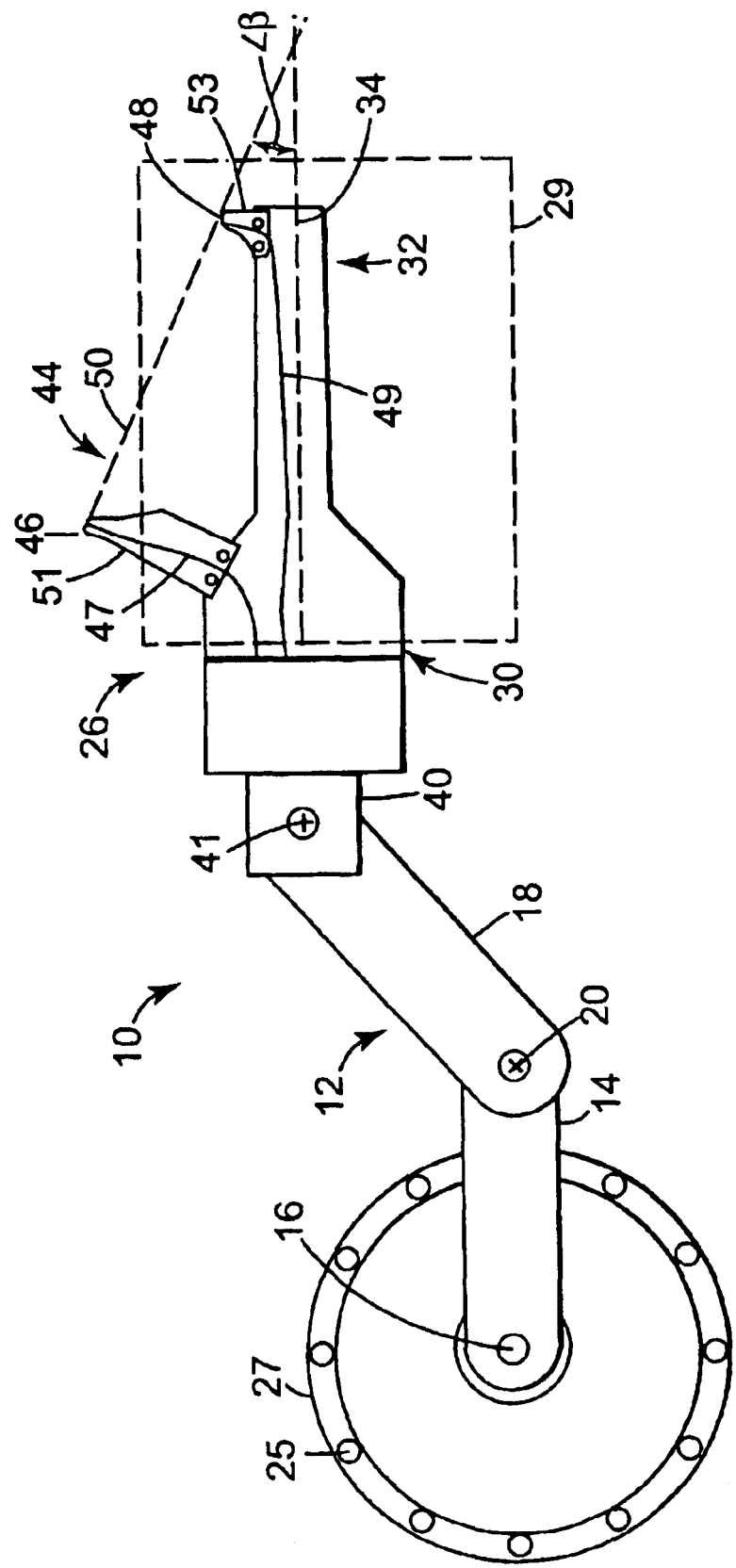
FIG. 3 is a schematic, top view of a robot system of the present invention, wherein the body of the end effector is in substantially horizontal orientation.
Figure 5:
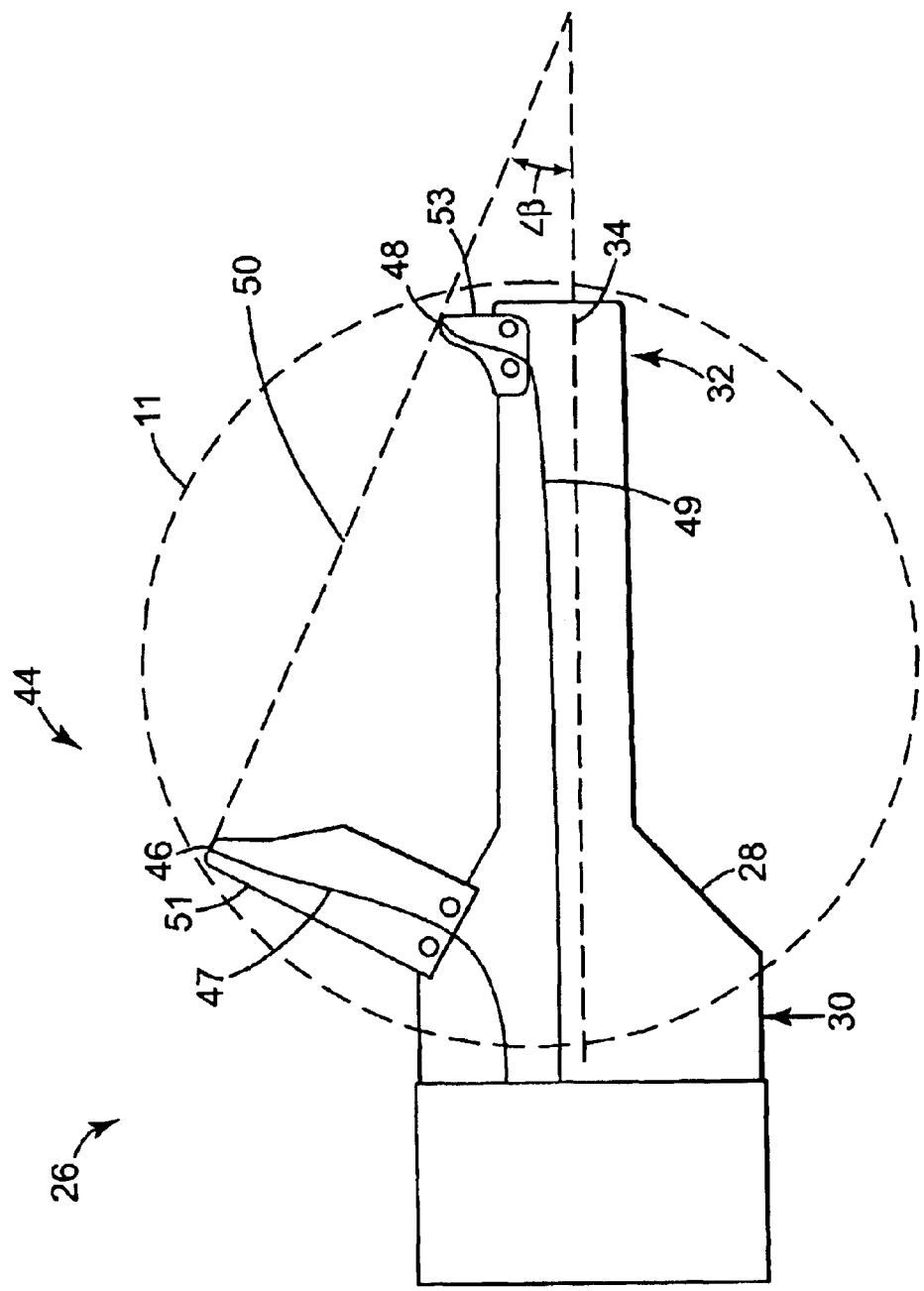
FIG. 5 is a plan view of an end effector of the present invention, wherein a footprint of a wafer is shown in phantom.

FIGS. 1 through 3 show one embodiment of a wafer transfer unit of the present invention in the form of a robot 10 that may be provided with many capabilities, including gripping one or more wafers such as wafer 11 (see FIGS. 7a and 8a); transferring the wafer 11 from one locale to another; releasing the wafer 11 at a particular locale; mapping batches of wafers 11 held in any orientation (e.g., vertically, horizontally, or otherwise) in a wafer holding structure (e.g., wafer holder); automated calibration (also known as "autoteaching") of the robot 10; and the like. See, e.g., FIGS. 4 through 7 described in more detail below.

This representative embodiment of a robot 10 generally includes a robot base 24 that may be moveable along one or more paths or may be fixedly secured at a particular locale, e.g., to the floor, wall, and or ceiling at the desired point of use. As shown, robot base 24 is fixedly attached to floor 23 by fasteners 25 and mounting plate 27. An elevating shaft 22 is operationally coupled to a suitable mechanism (not shown) in base 24 to allow shaft 22 to be controllably raised and lowered. This helps to provide robot 10 with motion capability through an axis 16 that is substantially perpendicular to, in this particular embodiment, the plane of floor 23.

In one embodiment, articulating arm 12 includes a first arm member 14 and a second arm member 18. First arm member 14 of articulating arm 12 is coupled to shaft 22. Preferably, each of arm members 14 and 18 are independently rotatable about axes 16 and 20, respectively. Such independent rotation, when combined with the motion of elevating shaft 22 through axis 16, provides tremendous flexibility and speed in reaching locales in three dimensional space. Alternatively, the movement of arm members 14 and 18 may be coupled.

End effector 26 is operably coupled to articulating arm 12 in any suitable fashion. For illustrative purposes, end effector 26 is shown as being coupled to second arm member 18 of articulating arm 12 via a coupling mechanism 40, and optional spacer 39, that is rotatable about vertical axis 41. Although shown as a separate component, all or portions of coupling mechanism 40 may be integral with articulating arm 12 and/or end effector 26. Coupling mechanism 40 helps to provide different modes of moving and/or changing the angular orientation of end effector 26 in three-dimensional space. One kind of motion, noted above, involves rotating end effector 26 about vertical axis 41.

Another kind of movement allows the main plane 29 of end effector 26 to be controllably adjusted relative to axis 34. Still another kind of movement, shown in FIGS. 6a and 6b, allows the main plane 29 of end effector 26 to be controllably adjusted relative to axis 36. Yet another kind of movement includes combinations of these, and the like. Other useful kinds of movements will be apparent to those skilled in the art and include movement relative to still other axes and combinations of these.

Rotatable movement of the end effector 26 about axis 34 is accomplished as is shown schematically in FIGS. 4a through 4d. With respect to the relative orientation of end effector 26 and coupling mechanism 40 shown in FIGS. 4a through 4d, end effector 26 is coupled to coupling mechanism 40 in a manner that allows the angle, Φ, between the main plane 29 of end effector 26 and axis 41 to be controllably altered clockwise (positive) and/or counterclockwise (negative) to any desired position in a desired range of motion.

As best shown in FIGS. 4a through 4d, this may be accomplished by a rotatable coupling that allows the end effector 26 to be rotated about longitudinal end effector axis 34 extending approximately along the centerline length of end effector 26. As an alternative to such centered positioning, axis 34 in other embodiments may be positioned closer to one side of end effector 26 or the other. Preferably, end effector 26 can be rotated about axis 34 through a range of motion such that the angle Φ may range from at least −90° to at least +90°, more preferably at least −180° to at least +180°, and even more preferably at least −360° to at least +360°.

Such rotatable movement about axis 34 is particularly useful in allowing end effector 26 to transfer the wafer 11 between locales in which the orientations of the wafer 11 are different, e.g., horizontal at one locale and vertical at another locale; for mapping either horizontal or vertical wafers within a relatively small three dimensional volume, and/or automated calibration of robot 10. Such capabilities are described further in connection with FIGS. 4 through 7, below.

Figure 6A:
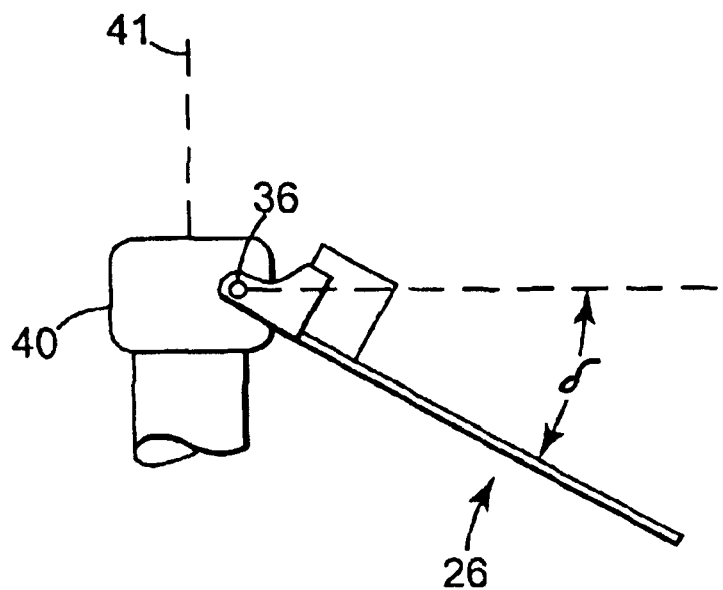
FIG. 6a is a side view of the end effector and coupling mechanism incorporated into the robot system of FIG. 1, wherein the end effector is oriented with its main plane pivoted downward at an angle δ of about −45 degrees relative to the horizontal.
Figure 6B:
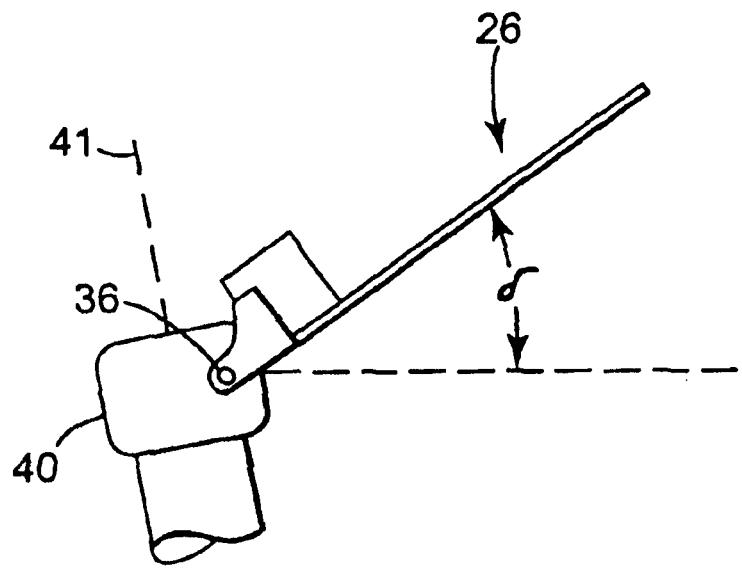
FIG. 6b is a side view of the end effector and coupling mechanism incorporated into the robot system of FIG. 6a, wherein the end effector is oriented with its main plane pivoted upward at an angle δ of about +45 degrees relative to the horizontal.
Figure 7A:
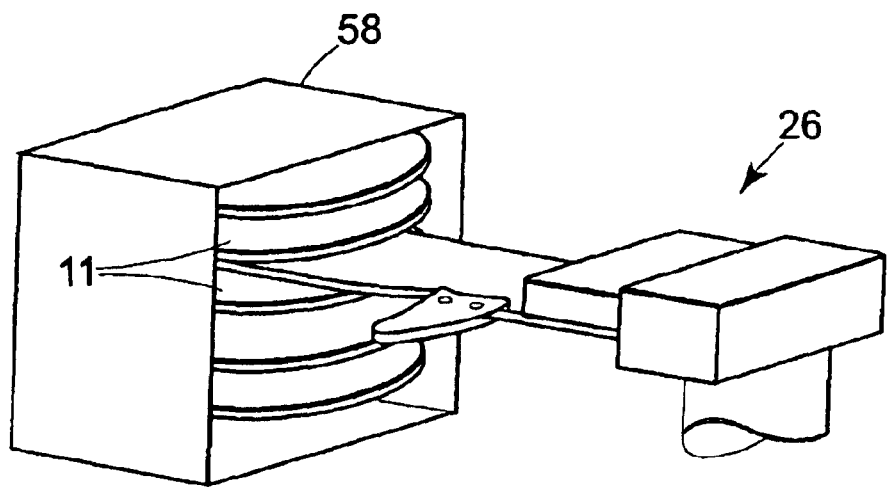
FIG. 7a is a schematic perspective view showing the end effector of FIG. 1 reaching into a wafer holding structure, e.g., a FOUP, to grip a horizontally stored wafer.

In addition or as an alternative to rotatable motion about axis 34, end effector 26 may be connected to coupling mechanism in a manner such that end effector may be pivoted by an angle δ relative to the axis 36 to any pivoted orientation in a desired range of motion as shown best in FIGS. 6a and 6b. If such δ-angle motion is provided, δ preferably may range from at least −20° to at least +20°, and more preferably at least −90° to at least +90°.

In preferred embodiments, end effector 26 has a relatively flat body 28, as shown in FIG. 2, with a relatively wide base 30 proximal to and connected to coupling mechanism 40 and a relatively narrow end 32 distal from coupling mechanism 40. Being relatively flat, body 28 has a low-profile. This low-profile geometry is particularly well suited for retrieving and positioning wafers 11 from tight spaces such as from among closely spaced wafers.

End effector 26 is generally provided with any suitable mechanism(s) (not shown) that allow end effector to releasably engage wafers 11 for pick up, transfer, and drop off. Any suitable mechanism that provides such releasable engagement may be used. Examples include edge gripping mechanism(s), differential pressure engaging mechanism(s) (e.g., vacuum engaging mechanism(s), mechanism(s) that operate in whole or in part via the venturi/bernoulli effect), combinations of these, and the like. Of these, edge gripping mechanisms are preferred, as these provide excellent control over wafer engagement in a wide range of wafer orientations. Edge gripping mechanism(s) are well known in the art and have been described, for example, in U.S. Pat. No. 6,256,555 B1 (Bacchi, et al.).

End effector 26 is generally provided with any suitable sensing mechanism(s) that allow an end effector of the present invention to provide a sensing path 50 (e.g., light path) that can be used to carry out wafer transfer, wafer mapping, and/or automated calibration functions. Preferred examples of useful sensing mechanisms include edge fiber optic mechanism(s). Fiber optic mechanisms are preferred, as these provide excellent determination of wafer presence and boundaries. Fiber optic mechanism(s) are well known in the art and have been described, for example, in U.S. Pat. No. 6,256,555 B1 (Bacchi, et al.).

FIGS. 1 through 3 illustrate the use of a fiber optic system 44 used in an end effector 26 of the present invention for mapping wafer(s) 11 and/or automated robot calibration. Wafer sensor system 44 includes an optical light source fiber 47 and an optical light receiver fiber 49. In one embodiment, light source fiber 47 is positioned relatively proximal to base region 30 and thus relatively distal from end region 32, while the light receiver fiber 49 is positioned relatively proximal to end region 32 and distal from base region 30. Of course, the relative locations of light source fiber 47 and light receiver fiber 49 may be reversed. Typically, fibers 47 and 49 are housed within end effector 26 and terminate at points 46 and 48 respectively to provide mutually facing light path openings to provide light path 50 between fibers 47 and 49. Advantageously, light path 50 thus includes a substantial directional component that extends along a length of end effector 26. Typically, this can provide such end effectors the ability to carry out wafer transfer and substantial aspects, if not the entirety, of an automated robot calibration methodology with enhanced motility in confined volumes and in a variety of orientations, including vertical and horizontal orientations and other desired orientations. Also, by being taught how to safely move a wafer within its intended range of motion, robot 10 need not also be taught how to account for the presence of sensor system 44.

Figure 7B:
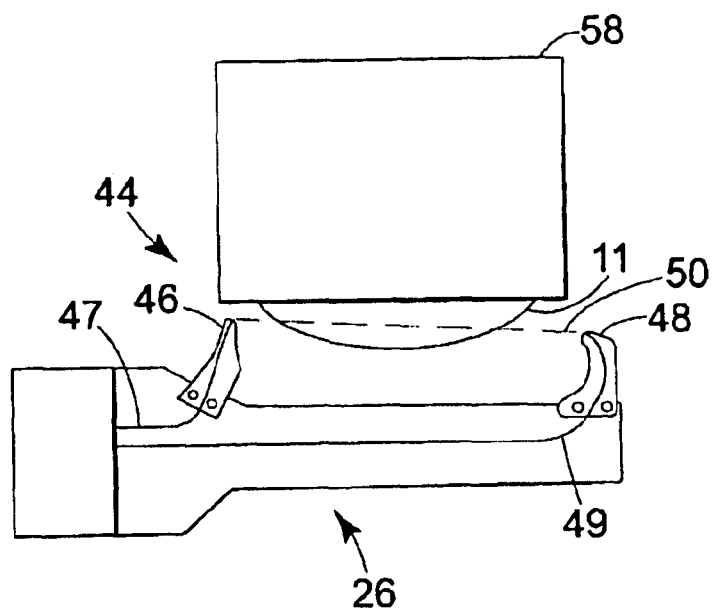

In a preferred embodiment shown, for example in FIG. 1, termination points 46 and 48 are spaced a suitable distance from a lengthwise edge of end effector 26 so that sensing functions can be carried out without undue risk of collision. The distance is not critical and may vary over a wide range. Preferably the distance is not so great to ensure that the sensing structure lies totally within the footprint of a wafer 11 being gripped by the end effector 26. This is shown in FIGS. 7b and 8b. Optionally, and as shown in FIGS. 1–3 and 5, fibers 47 and 49 may also be housed in respective fingers 51 and 53, in addition to end effector 26, to provide increased distances between termination points 46 and 48 from the nearby edge of end effector 26. Such increased distance makes it easier for light path 50 to sense other items while minimizing the risk of collision between end effector 26 and such items. On the other hand, if light path 50 is spaced too far away from end effector body 28, the resultant footprint of end effector 26 may be too large for end effector 26 to easily fit into or move through some locales.

To help maintain the low profile of end effector 26, sensor system 44 preferably is positioned such that termination points 46 and 48, of light fibers 47 and 49 respectively, and the light path 50 lie at least substantially within the main plane of body 28. Advantageously, and as best seen in FIG. 7b, sensor system 44 and light path 50 also preferably reside entirely within the main plane of wafer 11.

Also in a preferred embodiment shown, for example in FIG. 1, light path 50 extends diagonally between the relatively wide base region 30 and relatively narrow end region 32 of end effector 26. Typically, light path 50 forms an angle β with the centerline (e.g., axis 34) of end effector 26. In one embodiment, angle β may be in the range from 0 degrees to 90 degrees. In another embodiment, angle β may be in the range from 0 degrees to 45 degrees. In another embodiment, angle β may be in the range from 0 degrees to 30 degrees. In still another embodiment, angle β may be in the range from greater than 0 degrees to 10 degrees.

As shown in FIG. 1, the angle β between light path 50 and axis 34 and orientation of light path 50 to the nearby edge of and along length of end effector 26, especially when used in combination with the ability to rotate and/or pivot end effector 26 about the axis 34 and/or axis 36 through angles Φ and/or δ, respectively, provides tremendous flexibility in carrying out wafer transfer, mapping, and/or automated calibration functions in a relatively small, three-dimensional volume. In any of these useful applications, the sensor system 44 can be used to detect the presence of objects and structures when the light path 50 is interrupted. See, e.g., FIGS. 7b and 8b and the related discussion herein. Fibers 47 and 49 extend to a light source/receiver module (not shown). Light source/receiver module conventionally detects an amount of light transmission between fibers 47 and 49 and, thereby, accurately senses the positioning of wafer(s) 11, or the like.

Figure 9:
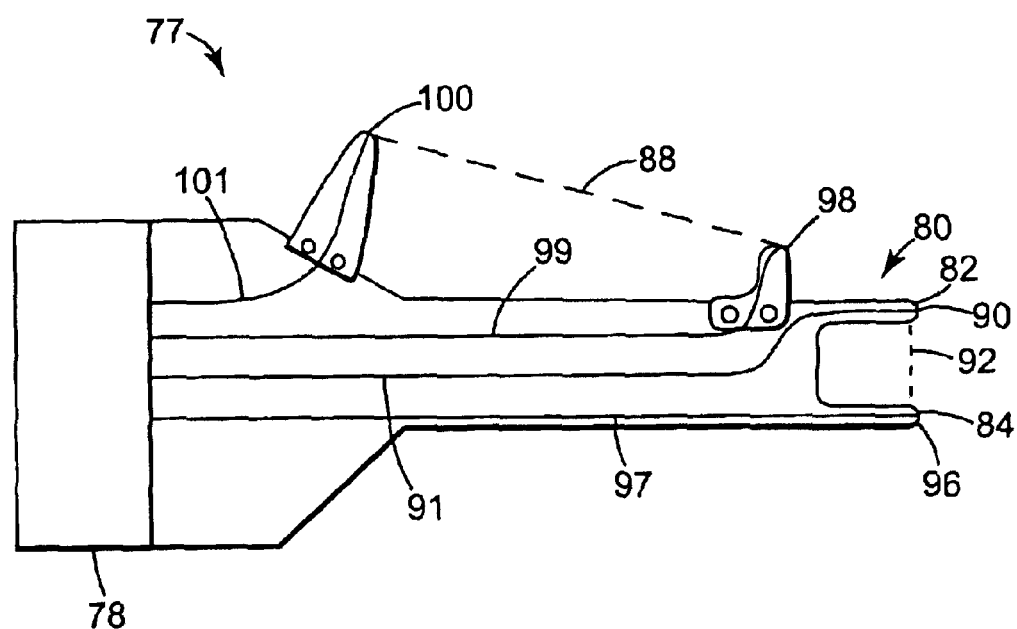
FIG. 9 shows an alternative embodiment of an end effector of the present invention.
Figure 10:
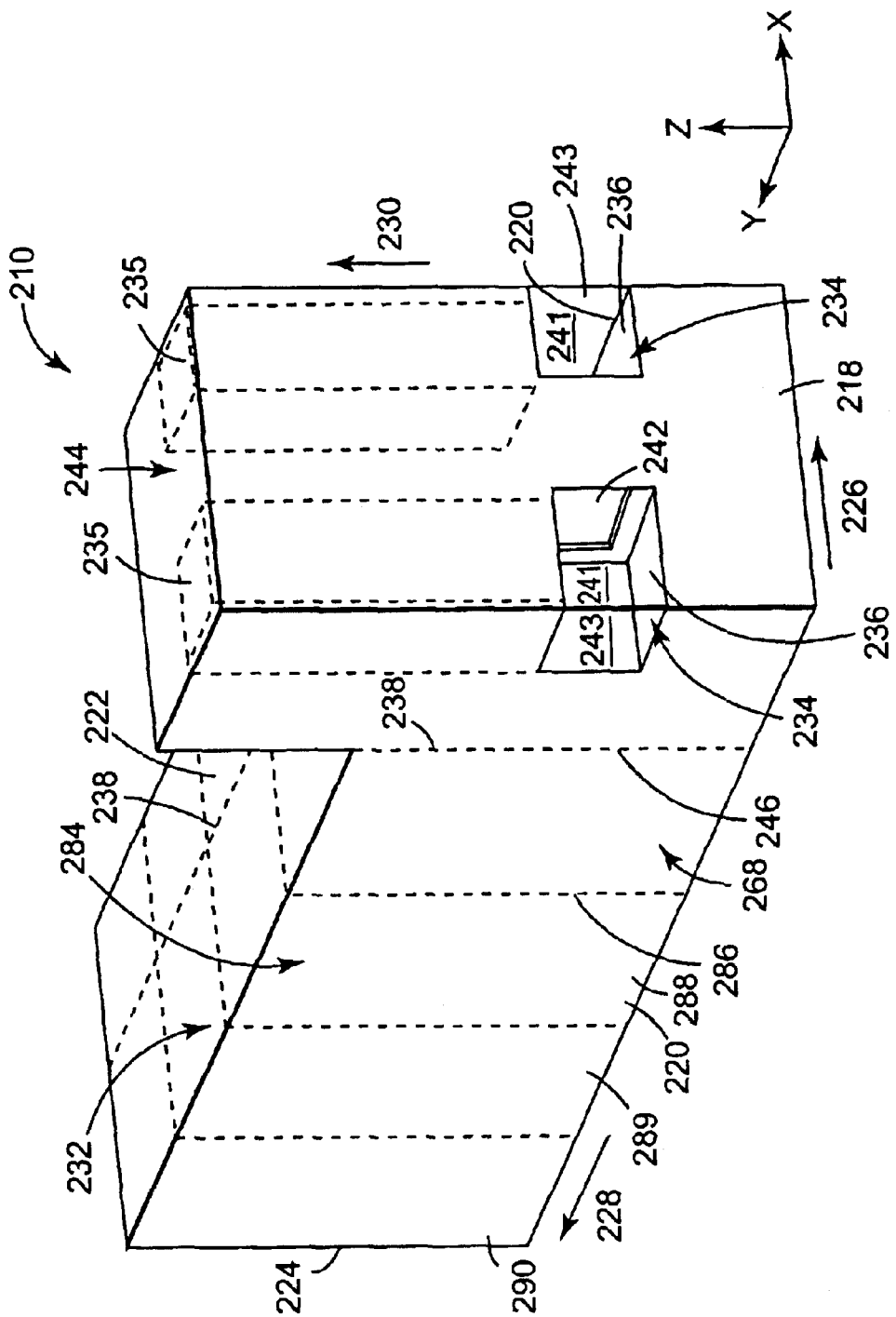
FIG. 10 is a schematic, perspective view of a tool of the present invention.
Figure 11:
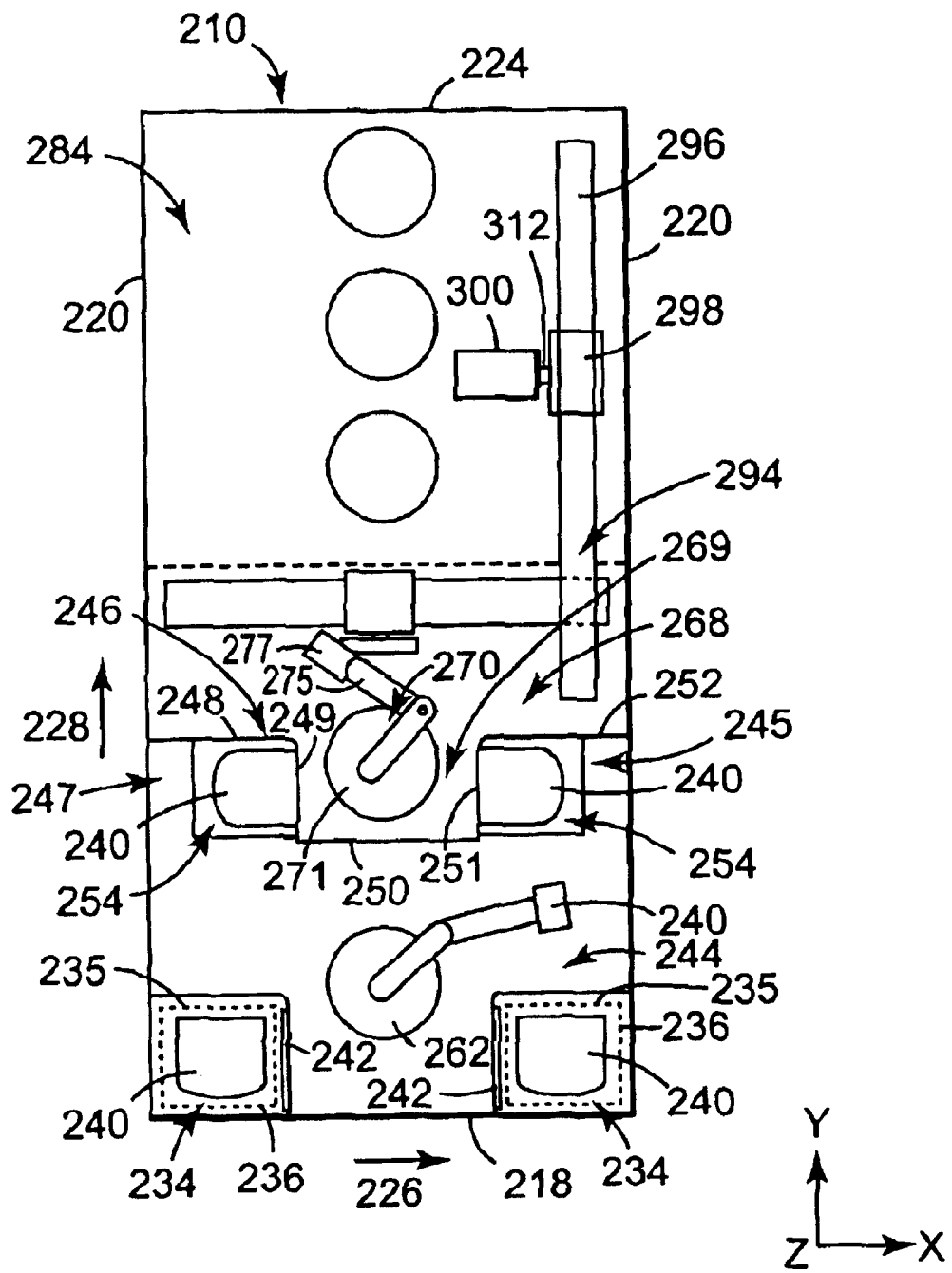
FIG. 11 is a schematic, plan view of the tool of FIG. 10 shown in a production line.
Figure 12:
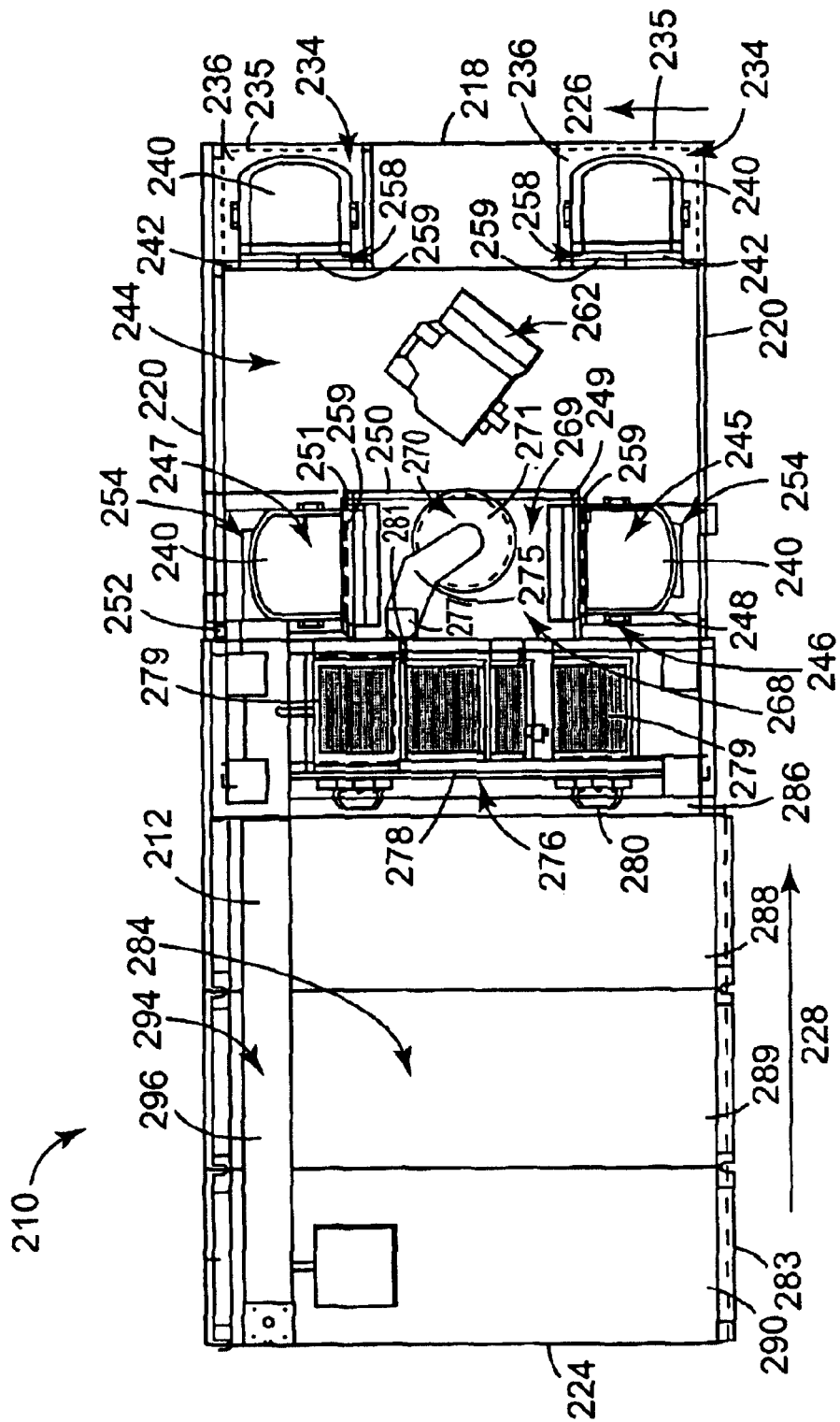
FIG. 12 is a more detailed plan view of the tool of FIG. 10, with some parts removed to emphasize some of the layout features of the tool.
Figure 13:
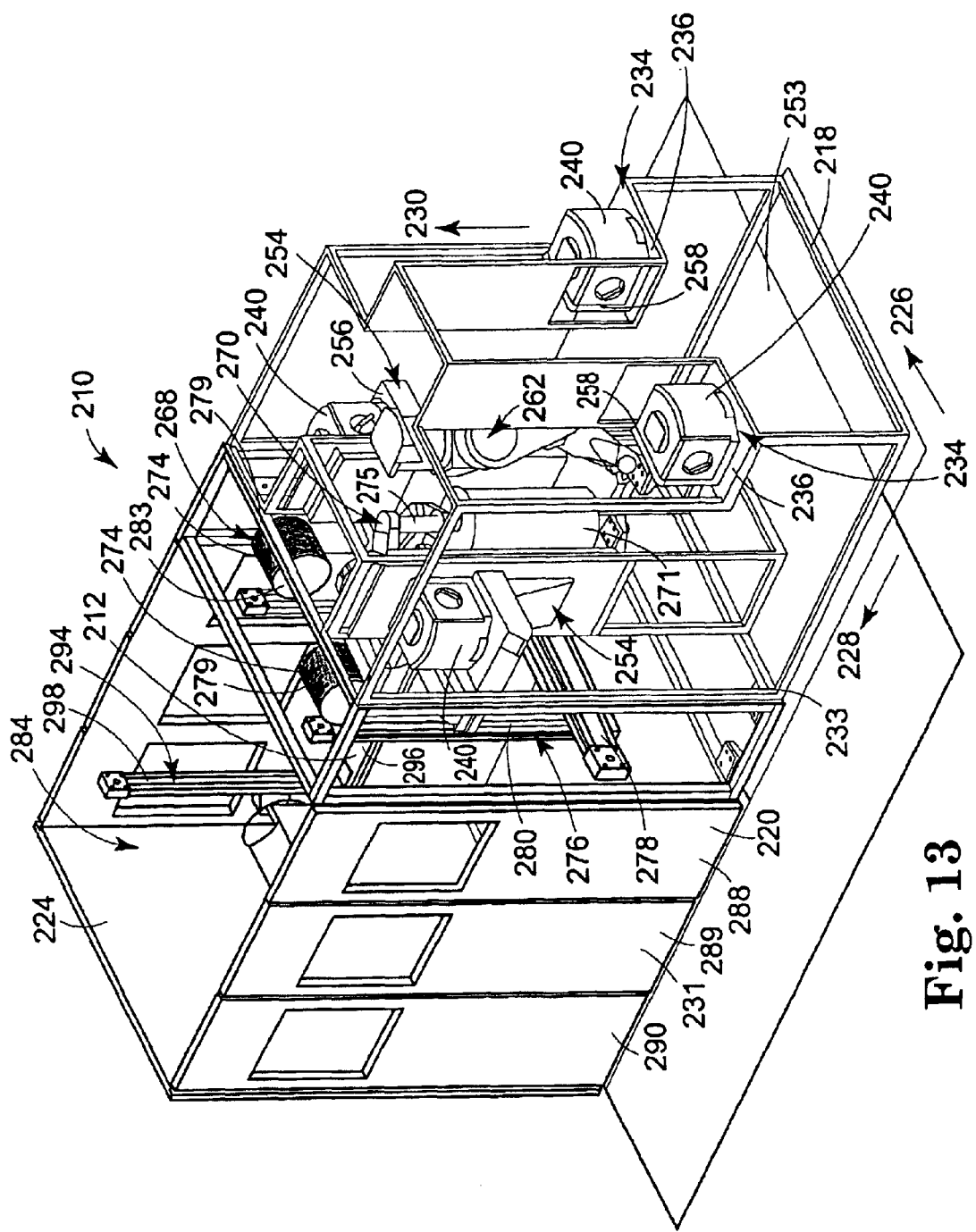
FIG. 13 is a perspective view of the tool of FIG. 10, with some parts removed, and wherein the z-axis slides of the robots 76 and 94 are shown in two positions and their respective horizontal slides.
Figure 14:
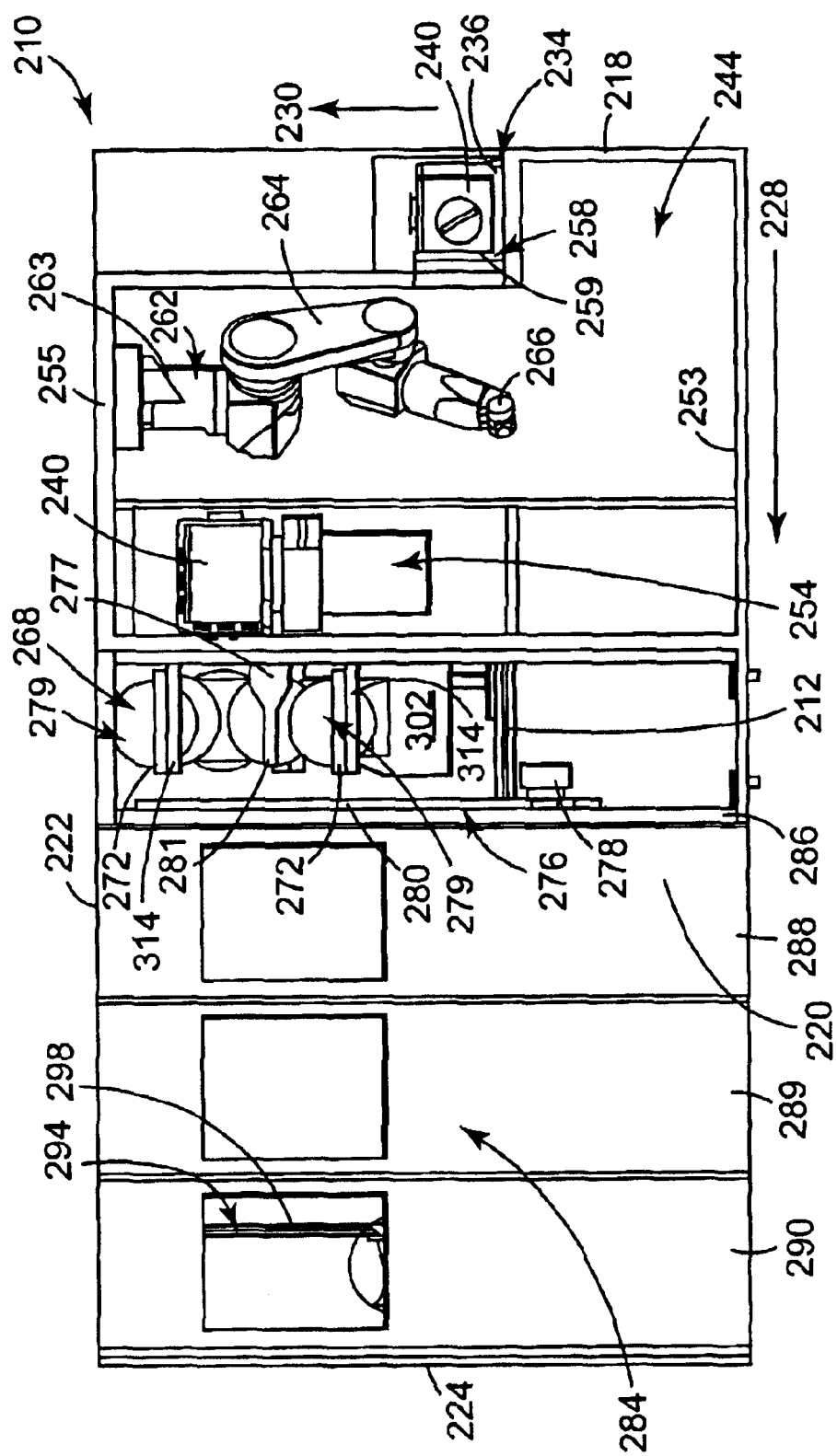
FIG. 14 is a side view of the tool of FIG. 10 with some parts removed.

Although sensor system 44 is shown as being positioned along one side of end effector 26, other positions may also be used. For instance, in addition to or as an alternative to sensor system 44, a similar sensor (not shown) may be positioned in mirror image fashion along the other side of body 28. Although less desirable from the perspective of maintaining a low-profile for fitting into tight spaces, sensor system 44 also could be positioned at least in part along the top or bottom of body 28. Additional sensors could also be used. For example, an optional reflective LED sensor 51 having a sensing element 53 at end 32 also could be used for scanning functions, such as mapping and/or automated calibration, if desired. Refer to FIG. 9, described further below.

The advantages, flexibility, and versatility of robot 10 are illustrated in FIGS. 7a–8b. In FIG. 4, robot 10 is being used to transfer wafers 11 to and/or from a FOUP 52 in which a plurality of closely spaced wafers 11 are stored. In FIG. 7b, robot 10 is being used to map the wafers 11 in FOUP 52. Note how easily robot 10 positions the end effector 26 with its length, extending generally across the front of the FOUP 52. The light path 50 can then be scanned up and/or down relative to the wafers 11 for mapping purposes such as by moving elevating shaft 22 in an axis substantially perpendicular to the plane of wafers 11.

FIG. 6 shows how robot 10 can be used to transfer wafers 11 to and/or from a wafer holder 58 in which wafers 11 are stored at least substantially vertically. End effector 26 is easily rotated about axis 34 so that body 28 is substantially vertical allowing body 28 of end effector 26 to releasably engage the vertical wafers 11.

Figure 8A:
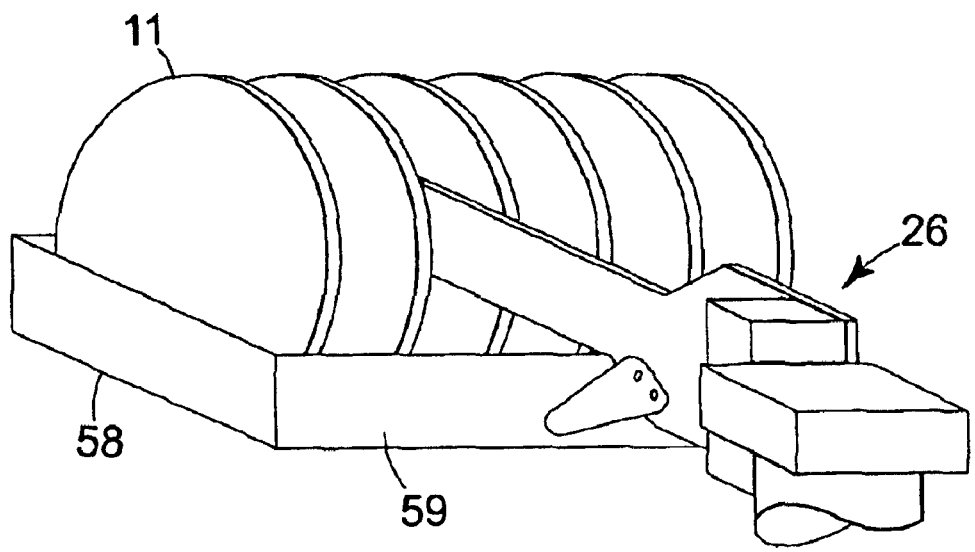
FIG. 8a is a schematic perspective view showing the end effector of FIG. 1 reaching into a wafer holding structure to grip a substantially vertically stored wafer.
Figure 8B:
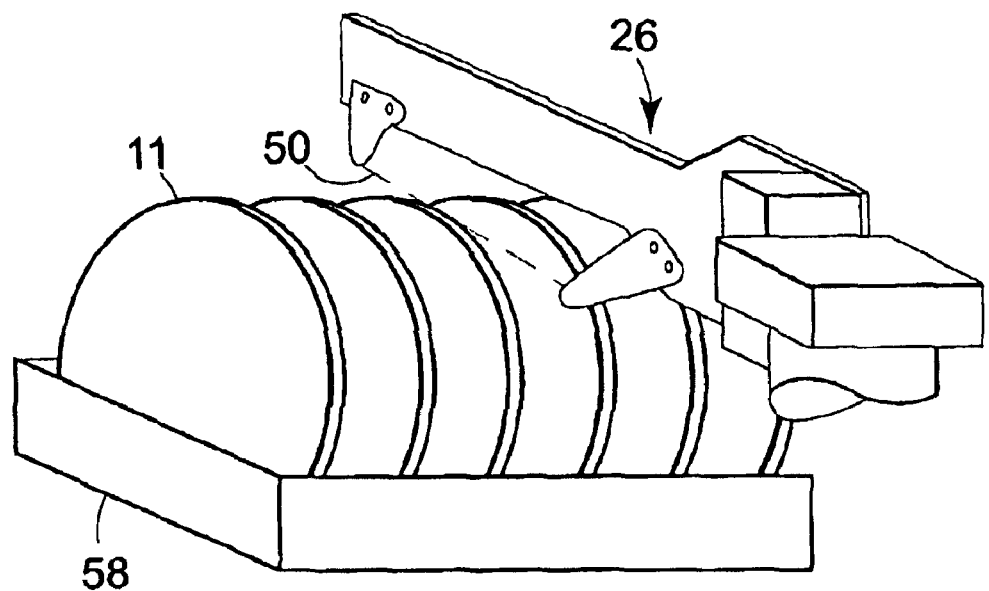

Wafer holder 58 of FIG. 8a includes structure 59 that prevents the wafers 11 from being easily scanned and/or mapped from the side, yet FIG. 8b shows how end effector 26 is easily rotated about axis 34 to a desired angle Φ and positioned over the wafers 11 to scan and map the wafers 11 generally from the top or otherwise above the obstructing structure 59 of wafer holding structure 58. Advantageously, very little volume above the wafers 11 is needed to position end effector 26 in this manner to scan the wafers 11. Typical conventional mapping devices require an end effector that resides in the same plane as the wafer(s) that are to be mapped. But, such conventional mapping devices lack the capability to rotate as described above. Thus, such conventional end effectors lack the capability to scan wafers as effectively in a non-horizontal orientation.

An alternative embodiment of the present invention (not shown) includes an end effector which incorporates an arcuate edge along a length defining a mouth that generally is large enough to fit a wafer. An optical sensor system generates a light path between fiber termination points and across the mouth for sensing purposes. Similar to other preferred embodiments, the end effector includes a base and an end. The base is relatively wide to help provide strength and rigidity, while the end is tapered to keep the mass at the end relatively low.

FIG. 9 shows an alternative embodiment of an end effector 77 having a base 78 and a bifurcated end 80 having first finger 82 and second finger 84. An optical receiver fiber 101 terminates at point 100 and an optical source fiber 99 terminates at point 98 on a side of end effector 77 to provide light path 88. An optical receiver fiber 91 terminates at point 90 and an optical source fiber 97 terminates at point 96 to provide a light path 92. Advantageously, being positioned between fingers 82 and 84, rather than extending beyond the end 80, fiber termination point 90 has a reduced tendency to obstruct insertion of end effector 77 into tight spaces as compared to a fiber termination point that extends beyond end 80.

FIGS. 10 through 20 show one manner of using end effector 116 in the illustrative context of tool 210. Process tool 210 includes housing 232 having a front side 218, sides 220, top 222, and rear 224. Housing 232 is formed from componentry including panels 231 and an underlying, supportive framework 233. Tool 210 has a width that extends along x-axis direction 226, a height that extends along z-axis direction 230; and a length that extends along y-axis direction 228. The front side 218 of tool 210 is provided with one or more interfaces through which batches of processable microelectronic substrates, typically carried in a suitable holder such as industry-standard front opening unified pods (FOUPs) 240, may be transported into and taken from tool 210. For purposes of illustration, tool 210 includes two such interfaces in the form load ports 234.

Each such load port 234 generally includes a shelf 236 on which a FOUP 240 may be placed when conveyed to and from tool 210. Placement of a FOUP 240 on shelf 236 for processing may be accomplished using overhead transport (OHT), automatic guided vehicle (AGV), personal guided vehicle (PGV), or any other suitable transport methodology. The open sides of each shelf 236 preferably are covered by a fixed and/or openable panels 241 and 243. In preferred embodiments, each of panels 241 and 243 is formed from a transparent, impact-resistant material such as polycarbonate or the like in order to allow each load port 234 to be visually inspected. It is also preferred that at least one of panels 241 or 243 for each shelf 236 be openable, e.g., by sliding downward, upward, or the like, to provide direct access to each shelf 236. A chimney 235 also provides access to each shelf 236 from above by an OHT in a conventional manner. Each load port 234 also generally includes a portal 242 providing egress to and from the interior of tool 210. Each portal 242 may optionally include a door or other suitable barrier structure (not shown) or the like in order to help isolate the interior of tool 210 for safety reasons.

When an OHT methodology is used to pick up and drop off FOUPs 240 from a load-port 234, the OHT mechanism typically conveys a FOUP 240 to and from a shelf 236 via a corresponding chimney 235. Alternatively, when other methodologies, such as AGV or PGV, are used to convey a FOUP 240 to and from a shelf 236, at least one of corresponding panels 241 and/or 243 is opened to provide access to the shelf 236. For safety reasons, while a panel 241 and/or 243 is opened in this manner, the corresponding portal 242 may be closed by a suitable structure (not shown), such as a slideable panel, hinged door, or the like.

Desirably, the load ports 234 at the front side 218 of tool 210 are positioned at a suitable height, depending upon the modes of transport to be used to convey FOUPs 240 to and from load ports 234. For example, one set of industry standards, specifies a shelf height of 900 mm when AGV or PGV modes are used. This 900 mm shelf height would also be suitable when OHT is likely to be used in combination with one or both of AGV or PGV. Thus, the desired height of shelves 236 may be determined by such practical concerns.

Tool 210 preferably includes three main sections. These are a buffer zone 244, a wafer transfer system 268, and a processing zone 284. Buffer zone 244 is positioned adjacent the front side 218 of tool 210. Buffer zone provides a workspace in which FOUPs 240 are moved to and from the interior of tool 210 through portals 242 of load ports 234. Buffer zone 244 extends from front side 218 back along the y-axis dimension 228 of tool to partition 246. Partition 246 provides a physical barrier between buffer zone 244 and wafer transfer system 268. Partition 246 allows a mini-environment to be established within wafer transfer system 268 that is isolated relative to buffer zone 244.

Partition 246 in this embodiment is formed from walls 248, 249, 250, 251, and 252. Walls 249 and 251 extend along a length of the y-axis direction 228 and thus are laterally adjacent both buffer zone 244 and wafer transfer system 268. Consequently, portions 245 and 247 of buffer zone 244 overlap portion 269 of wafer transfer system 268 in the y-axis direction. This overlap allows the overall y-axis dimension of tool 210 to be dramatically reduced relative to a conventional tool that lacks such overlap and/or allows the storage capacity within buffer zone 244 to be increased.

Walls 249 and 251 each include an interface through which substrates 274 may be transferred to and from buffer zone 244 and wafer transfer system 268. In the preferred embodiment, these interfaces are in the form of industry standard pod door opener (PDO) assemblies 254. Each PDO assembly 254 generally includes a faceplate 258 having an airlock structure 259 providing environmentally controlled egress between buffer zone 244 and wafer transfer system 268. Each PDO assembly 254 also includes a shelf 256 upon which a FOUP 240 may be positioned to operatively engage the airlock structure 259.

Each of walls 249 and 251, and hence each of faceplates 258, are generally at least substantially parallel to the y-axis direction 228, and hence at least substantially perpendicular to the x-axis direction 226. This orientation generally requires that the FOUPs 240 be rotated 90° when transferred from a load-port 234 to operatively engage one of the PDO assemblies 254. The rotation of the FOUPs 240 is handled by the buffer zone robot 262.

Whereas the height of shelves 236 may be more restricted by practical concerns, each shelf 256 of PDO assembly 254 may be positioned with much greater flexibility at any desired height within buffer zone 244 as desired. In preferred embodiments, it has been found very desirable to position each of shelves 256 above the industry standard height of 900 mm, e.g., at a height in the range of 1000 mm to 2000 mm, preferably 1300 mm to 1800 mm, more preferably about 1600 mm. Doing this creates useable space beneath the PDO assemblies 254, robot 270, robot 276, and basically all the componentry of wafer transfer system 268 that can be used to house other tool components such as robot controllers, power panels, electrical boxes, air/$N_2$ distribution panels, other process support hardware, and the like. Thus, raising the height of the shelves 256 allows multiple tool functions to be stacked over the same x-y footprint of tool 210. This is another way in which the overall footprint of tool 210 is dramatically reduced as compared to conventional tools. Raising shelves 256 also has the practical effect of allowing the deck height within the processing zone 284 to be raised without significantly increasing the z-stroke of the wafer transfer robot 270 (described further below), wafer holding structure transfer robot 276 (described further below), or process zone robot 294 (described further below). The increased deck height also creates space under the processing zone stations 288, 289, and 290 that can be used to house various kinds of tool componentry. Again, multiple tool functions are stacked in the z-axis, helping to reduce the overall x-y footprint of tool 210.

A buffer zone robot 262 is positioned inside buffer zone 244 and preferably is used at least to transport FOUPs to and from load ports 234 and any other locus within the operational range of robot 262, to and from one or more storage positions (not shown) inside of buffer zone 244 and any other locus within the operational range of robot 262, and/or to and from operative engagement with PDO assemblies 254 and any other locus within the operational range of robot 262. Robot 262 is preferably capable of sufficient multi-axis movement so that robot 262 is able to reach as many locations as possible at any of a wide desired range of x, y, and z coordinates within the volume of buffer zone 244. In actual practice, a 6-axis robot would be suitable for use as robot 262.

Robot 262 includes base 263, articulating arm 264 extending from base 263, and a suitable end effector 266 for engaging FOUPs 240. Base 263 may be mounted to the floor 253 and/or ceiling 255 of buffer zone 244, but is preferably ceiling-mounted in a preferred embodiment. Mounting the robot 262 on the ceiling 255 advantageously allows the space below the robot to be used for additional FOUP storage locations and/or other tool functions. This is another way in which multiple tool functions are stacked in the z-axis, further helping to reduce the x-y footprint of tool 210.

As used herein, the terminology "wafer transfer system" refers generally to a system incorporated into a tool or provided as an adjunct to a tool that withdraws processable substrates from one or more substrate storage devices, such as a FOUP, helps to convey the withdrawn substrates at least partially to and from a processing resource, and then returns the processed substrates to the one or more storage devices after processing. A wafer transfer system of the invention may convey wafers singly or in batches. In some embodiments, the wafer transfer system may include componentry, e.g., one or more robots, one or more wafer holding structures, or the like, that convey individual substrates or groups of substrates directly to and from a processing resource. In other embodiments, the wafer transfer system may include componentry, e.g., one or more robots, one or more wafer holding structures, one or more wafer elevators, or the like, that are used to convey batches of substrates to and from a processing resource.

As used herein, the terminology "batching station" refers generally to a location within a wafer transfer system at which a batch of two or more processable substrates is assembled by wafer transfer system componentry using substrates withdrawn from one or more storage devices. The batching station preferably is also used as a location at which a previously assembled batch of substrates is unbatched after processing by wafer transfer system componentry and returned to one or more storage devices.

A preferred embodiment of a wafer transfer system 268 is incorporated into tool 210 and is shown in FIGS. 10–20. The wafer transfer system 268 is generally positioned between at least a portion of the buffer zone 244 and at least a portion of the processing zone 284. Although tool 210 preferably includes partition 246 to environmentally isolate wafer transfer zone 268 from buffer zone 244, wafer transfer system 268 need not, if desired, include an environmental barrier between wafer transfer system 268 and processing zone 284. For purposes of illustration, however, optional partition 286 is included to provide a barrier between at least a portion of wafer transfer system 268 and processing zone 284.

Wafer transfer system 268 provides a working space in which processable substrates 274 stored in FOUPs 240 are transferred one at a time from one or more FOUPs 240 engaged with one or both PDO assemblies 254 to suitable wafer holding structure(s) 272 at a batching station 273. Wafer holding structures 272 may hold batches of substrates 274 during processing and/or optional storage, as desired. After processing is completed, the substrates may be transferred from the wafer holding structure(s) 272 positioned at batching station 273 back to FOUP(s) 240 engaged with PDO assembly(ies) 254. Using PDO assembly 254 as an interface for this transfer between FOUPs 240 and wafer holding structures 272 helps to protect the integrity of the environment within wafer transfer system 268 and processing zone 284.

Wafer transfer system 268 also may provide a working space in which one or more wafer holding structures 272 holding one or more processable substrates 274 can be transferred to and from processing zone 284 at a hand off station 283. Wafer transfer system 268 optionally also may provide a working space in which one or more wafer holding structures 272 holding one or more processable substrates 274 can be transferred to and from one or more storage locales located within wafer transfer system 268 and/or processing zone 284.

Wafer transfer system 268 includes componentry for handling the desired transport of substrates to and from FOUPs engaged at PDO assemblies 254, to and from wafer holding structures 272, to and from the processing zone 284, and/or to and from storage locale(s). Preferred componentry of wafer transfer system 268 includes wafer transfer robot 270 and wafer holding structure transfer robot 276. Wafer transfer robot 270 is positioned within portion 269 and includes base 271, articulating arm 275, and an end effector 116 of the present invention. The operational range of robot 270 extends at least from PDO assemblies 254 to the at least one batching station 273, allowing robot 270 to transfer substrates 274 between FOUPs 240 engaged at PDO assemblies 254 and wafer holding structures 272 positioned at batching station 273.

Advantageously, the wafer transfer robot 276 in this embodiment is positioned between the two opposed PDO assemblies 254 allowing robot 276 to easily transport substrates 274 between the PDO assemblies 254 and the wafer batching station 273. This configuration allows the y-axis dimensions of the PDO assemblies 254 and the y-axis dimension of the robot 276 to overlap, reducing the total y-axis dimension of tool 210 needed to accommodate these tool components. The y-axis footprint of tool 210 is dramatically reduced as compared to a conventional tool lacking this overlap.

End effector 116 is coupled to arm 275 preferably via a rotatable connection so that the end effector 116 can be rotatably positioned horizontally, vertically, or at any desired orientation comprising both horizontal and vertical components. This facilitates transport of wafers between FOUPs 240 and wafer holding structures 272 inasmuch as the substrates may be typically housed horizontally in the FOUPs 240 but at least substantially vertically in the wafer holding structures 272. End effector 116 handles substrates 274 individually using edge-gripping capabilities.

The end effector 116 of wafer transfer robot 270 optionally may be two sided, e.g., having the ability to grip a substrate 274 from either side of the end effector 116. Such an end effector can pick up substrates 274 in one orientation using one side of the end effector 116 for clean substrates 274 and then be flipped 180 degrees to pick up dirty substrates 274 with the other side of the end effector. Advantageously, this will help reduce contamination transfer from dirty to clean substrates 274.

Wafer holding structure transfer robot 276 in a preferred embodiment is in the form of a multiple-axis gantry that generally includes at least an x-axis slide 278 and a z-axis slide 280. End effector 282 on z-axis slide 280 is used to engage wafer holding structures 272. In operation, z-axis slide 280 can move horizontally back and forth to any desired position along a length of x-axis slide 278, while end effector 282 can move up and down to any desired position along a length of z-axis slide 280. This dual-axis movement allows end effector 282 to be positioned and/or moved along a pathway over a wide range of desired x–z coordinate positions within wafer transfer system 268. Advantageously, this allows multiple "levels" of the wafer transfer system 268 to be used for substrate handling/storage/processing operations. Use of the z-axis dimension to provide wafer transfer system 268 with multiple levels allows different aspects of the wafer transfer system 268 to be stacked vertically instead of spread out horizontally. This exploitation of the z-axis dramatically minimizes the footprint of the wafer transfer system 268 and is another way in which both the x-axis and y-axis dimensions of tool 210 are reduced as compared to conventional tools in which wafer transfer operations are carried out predominantly on only a single level.

Figure 16:
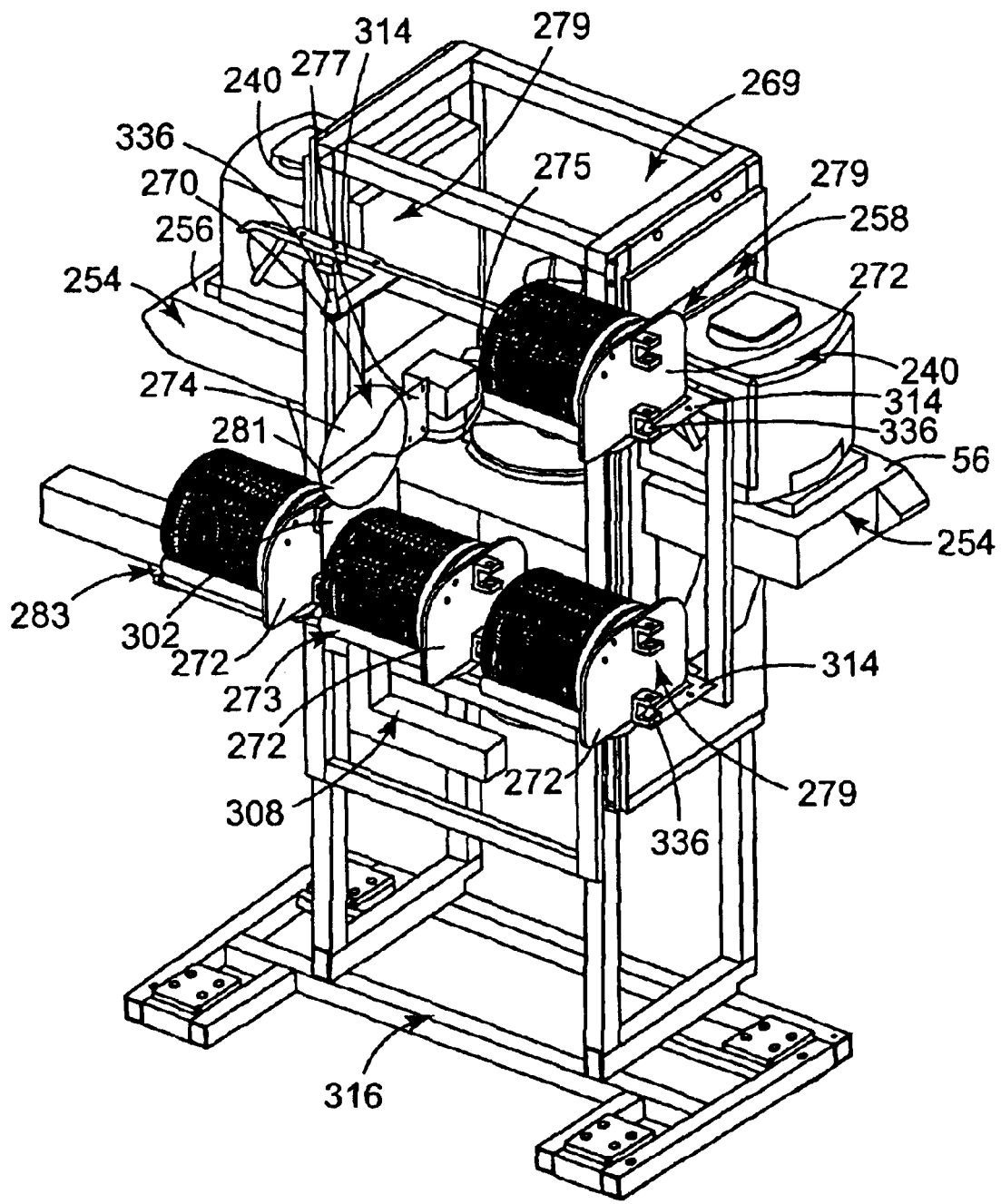
FIG. 16 is a perspective view of a portion of the wafer transfer system incorporated into the tool of FIG. 10 shown in combination with an opposed pair of PDO assemblies coupled to the wafer transfer system.
Figure 17:
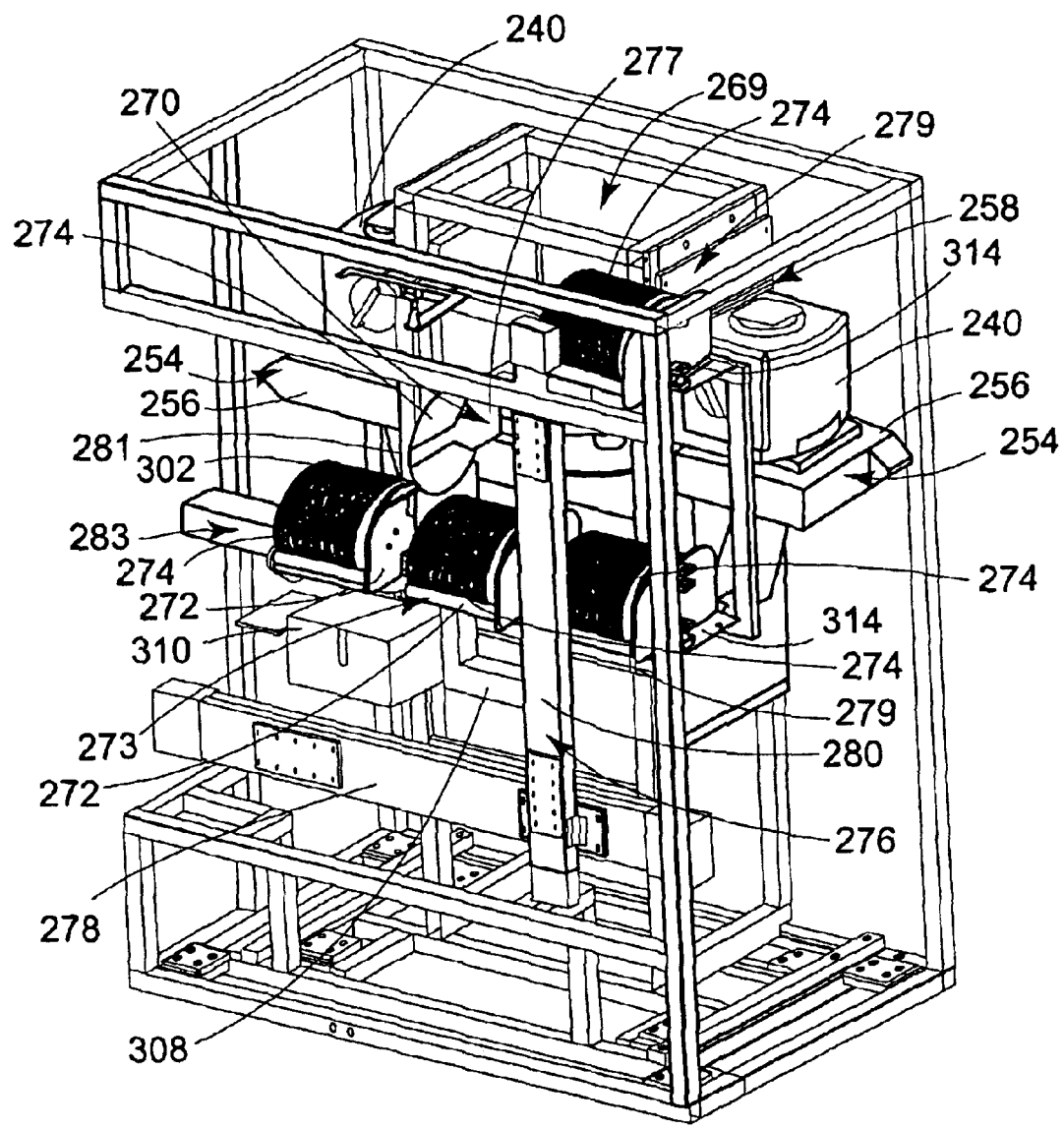
FIG. 17 is another perspective view of a portion of the wafer transfer system incorporated into the tool of FIG. 10 shown in combination with an opposed pair of PDO assemblies coupled to the wafer transfer system.

FIGS. 16 and 17 best illustrate the versatile manner by which wafer transfer system 268 may exploit the z-axis to accommodate significant substrate handling operations over a relatively small x-y footprint. As illustrated, wafer transfer system 268 may include a batching station 273 at which substrates 274 may be loaded (i.e., batched) and unloaded (i.e., unbatched) into a wafer holding structure 272. In addition to the supply of substrates 274 being batched (or unbatched) at batching station 273, one or more wafer holding structures 272 storing additional, batched, in-process substrates 274 may be stored at one or more storage buffer stations 279 located at the same or higher levels of wafer transfer system 268. For purposes of illustration, one batched supply of substrates 274 is shown as being stored at the buffer station 279 located proximal to and at the same level as batching station 273. Another batch of substrates 274 supported upon a wafer holding structure 272 is being stored at one of the upper buffer stations 279, while another one of the upper buffer stations 279 is open and unoccupied. A wafer holding structure 272 storing substrates 274 may also be stored at hand off station 283, which is within the operational reach of process zone robot 294 for pick up of substrates 274 before processing and drop off of the substrates 274 after processing.

Figure 19:
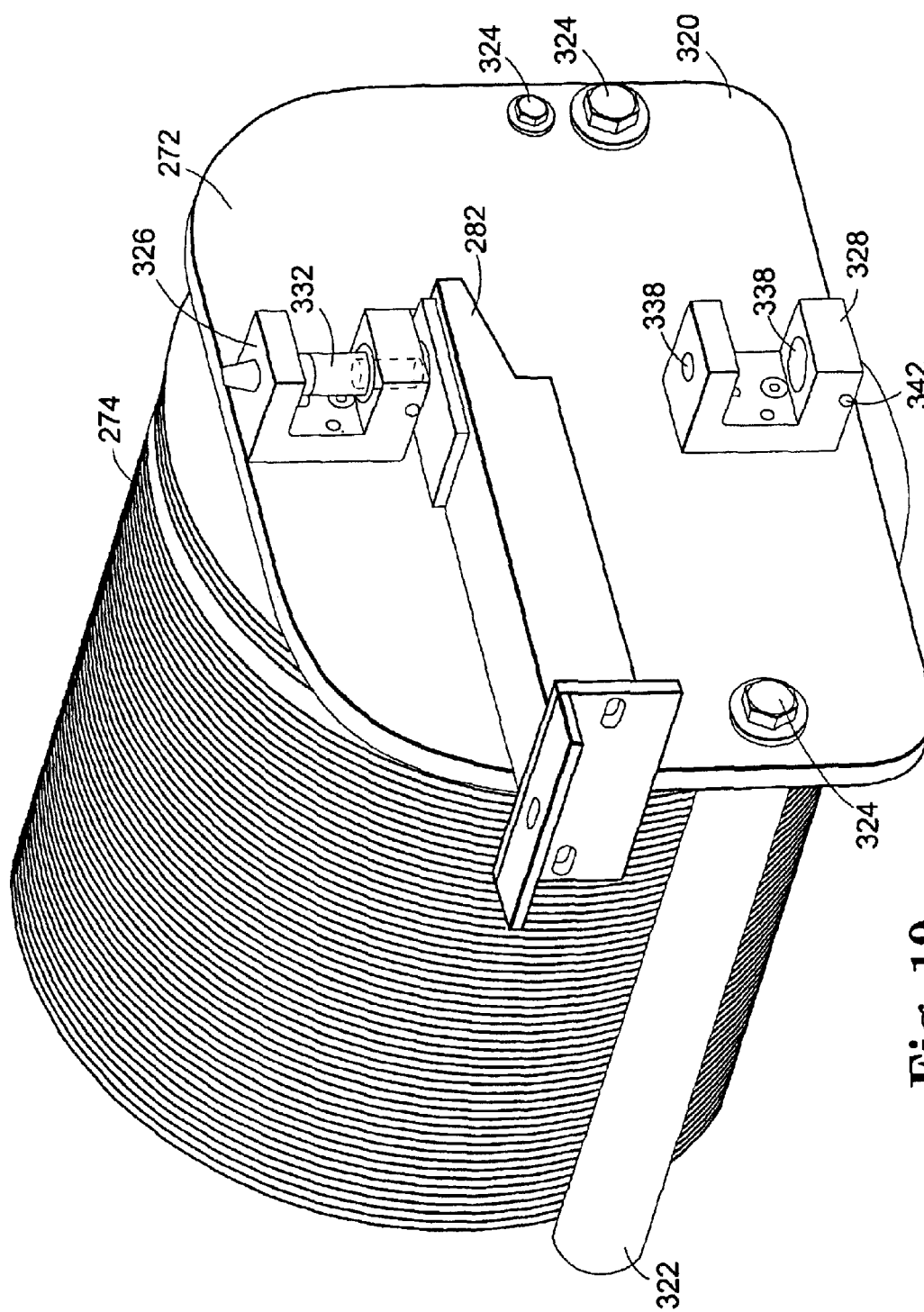
FIG. 19 is a perspective view showing a robot end effector holding a wafer holding structure used in the wafer transfer system of FIG. 15, wherein a batch of substrates is supported in the wafer holding structure.
Figure 20:
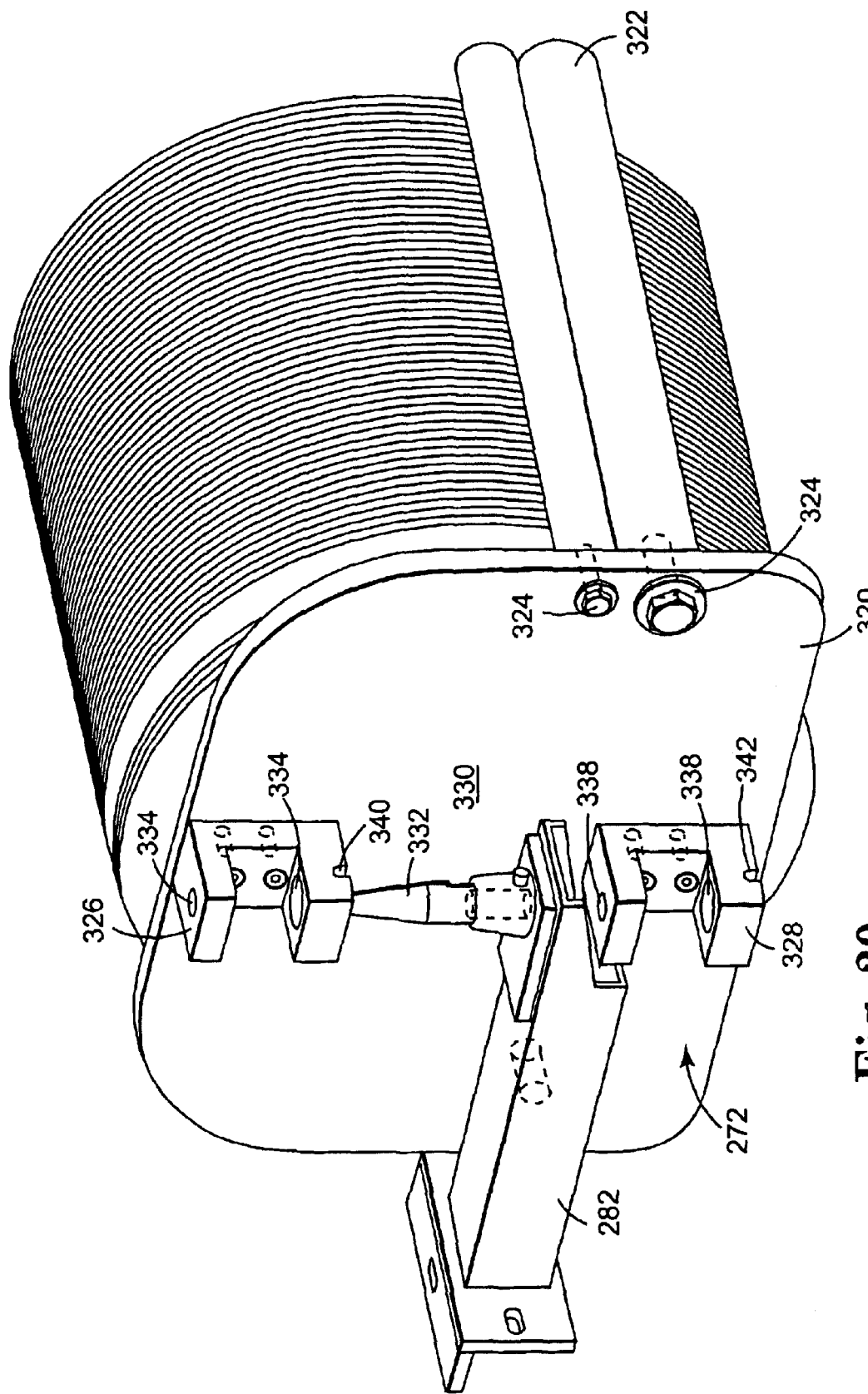
FIG. 20 is another perspective view of the wafer holding structure of FIG. 10, showing the coupling mechanisms between the end effector and the wafer holding structure in more detail.

A preferred embodiment of wafer holding structure 372 supporting a batch of substrates 374 is shown best in FIGS. 19 and 20. Wafer holding structure 372 includes side plate 320 and projecting arms 322 extending from side plate 320. Arms 322 optionally may be slotted to help hold substrates 374 more securely. The arms 322 are rigidly connected to the plate 320 by any suitable attachment technique such as by bolts, screws, threaded engagement, glue, welds, rivets, brackets, and the like to help ensure that the substrates 374 are securely and stably supported. For purposes of illustration, one or more bolts 324 are used. Brackets 326 and 328 are mounted to plate 320. Brackets 326 and 328 provide means by which wafer holding structure 372 may engage end effector 382 and shelves 314, respectively. Upper bracket 326 has provided therein holes 335 that are designed to releasably receive tapered post 332 of end effector 382, allowing end effector 382 to pick up wafer holding structure 372. One or more pins 330 project outward from the base of post 332 and engage one or more corresponding aperatures 341 in bracket 326 to help prevent wafer holding structure 372 from rotating about post 332. Lower bracket 328 is provided to releasably receive tapered post 336 of a shelf 314. Like post 332, the base of post 336 also includes pin(s) (not shown) to engage corresponding aperture(s) 343 on bracket 328 to help prevent wafer holding structure 372 from rotating about post 336. The wafer holding structures 372 may also be referred to in the art as "furniture".

FIGS. 19 and 20 best show how each wafer holding structure 372 preferably holds not just a batch of processable substrates 374, but also a suitable supply of one or more, typically at least two or more, preferably at least 4 or more, so-called "dummy" wafers 374'. A supply of dummy wafers 374' generally stays in each wafer holding structure 372 and may be used during batching to fill empty slots and/or cap the ends of a batched supply of substrates 374, as desired. When processed substrates 374 are being unbatched, any such cap or filler dummy wafers 374' can be returned to their storage positions in the corresponding wafer holding structure 372 so as to be available for use in subsequent processing operations.

Typically, multiple wafer holding structures 372, are desirably located within the wafer transfer system 368 to allow multiple batches of substrates 374 to be in-process at any one time. These are typically stored at positions reachable by the wafer holding structure transport robot 376. It is desirable to have at least one more available storage position than the number of wafer holding structures 372 so that wafer holding structures can be moved about the wafer transfer system 368 from one locale to another as desired.

Figure 15:
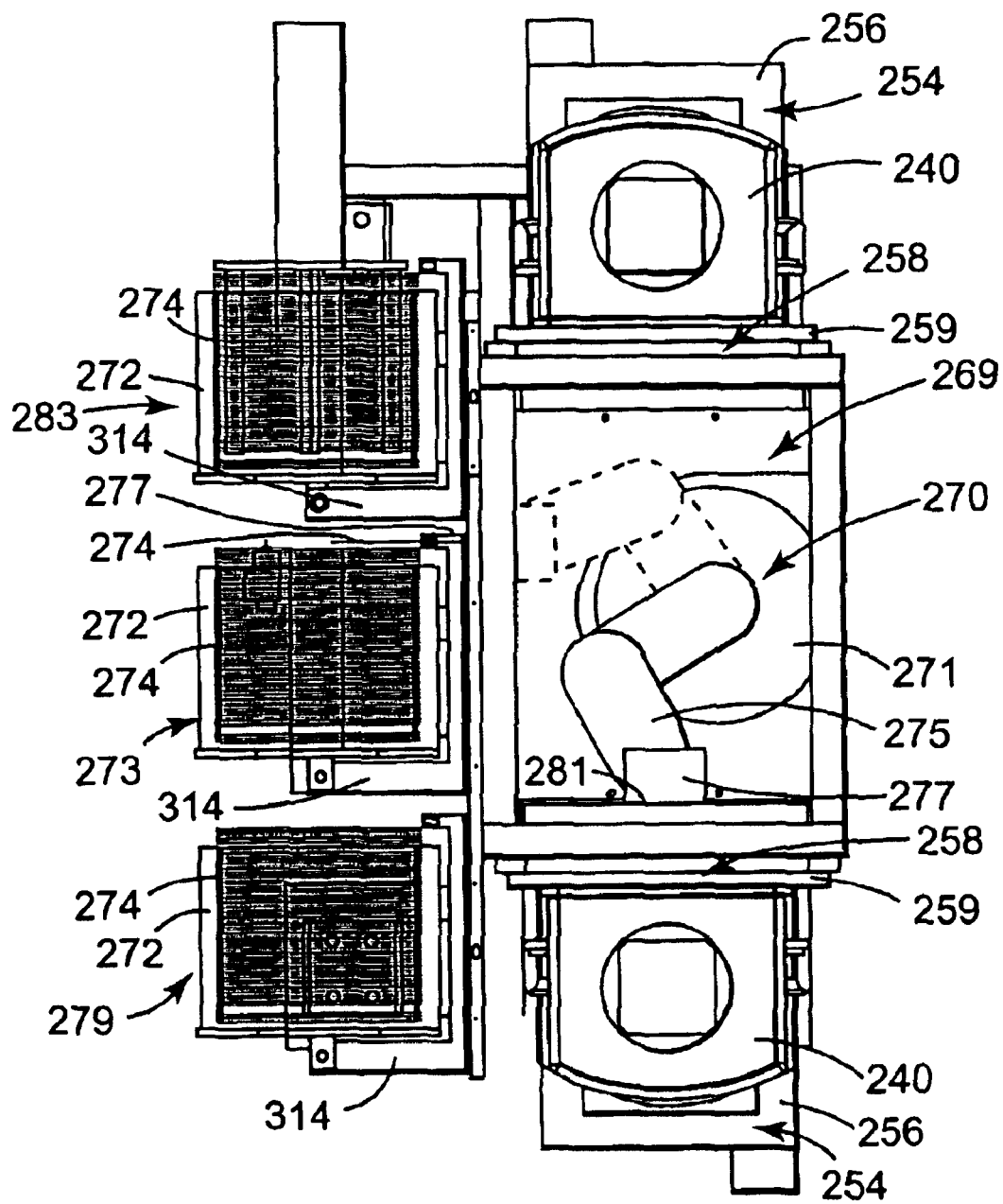
FIG. 15 is a top view of portions of a wafer transfer system of the present invention incorporated into the tool of FIG. 10 in combination with an opposed pair of PDO assemblies coupled to the wafer transfer system.

FIGS. 15–17 best illustrate preferred embodiments of shelves 314, each of which may be used to releasably hold a respective wafer holding structure 372 from time to time at one of stations 373, 380 or 383. In the preferred embodiment shown, each shelf 314 is generally u-shaped. Each shelf 314 desirably includes an upwardly projecting, tapered post 336 that kinematically engages corresponding apertures 338 of bracket 328 on wafer holding structure 372. As noted above, each post 336 includes one or more alignment pins (not shown) that engage one or more corresponding apertures 343 of bracket 328 on wafer holding structure 372 to help hold the wafer holding structure 372 in proper alignment on shelf 314 for pick up and drop off by end effector 382. The wafer holding structures 372 are generally moveable within wafer transfer system 368, while shelves 314 are generally fixedly secured in position.

A single wafer elevator 302 may be used at the batching location 373 to help lower substrates 374 into (i.e., batch) and/or lift substrates 374 from (i.e., unbatch) a wafer holding structure 372. The single wafer elevator 302 is typically in the form of a vertical plate having a suitable thickness so that it can fit between two batched substrates 374 on either side of an open wafer holding structure position. In other words, for any given three consecutive substrate holding positions in a wafer holding structure 372, the elevator 302 can fit into the open space when only the first and third of such holding positions are occupied. The elevator 302 also may optionally include componentry (described further below) that can rotate substrates 374 for alignment purposes. For example, the edges of some substrates 374 are notched in accordance with industry standards, and it may be desirable to align such notches to a desired angular orientation for processing. As an alternative to using components of the elevator 302 to accomplish notch alignment within the vertical stack of substrates 374 being loaded into a wafer holding structure 372, a conventional batch notch aligner can be used to rotate the wafer stack and catch the notch on each wafer, thus stopping its rotation, until all the notches have been caught. The stack as a whole can then be rotated until all the notches are oriented in the desired position.

Figure 18:
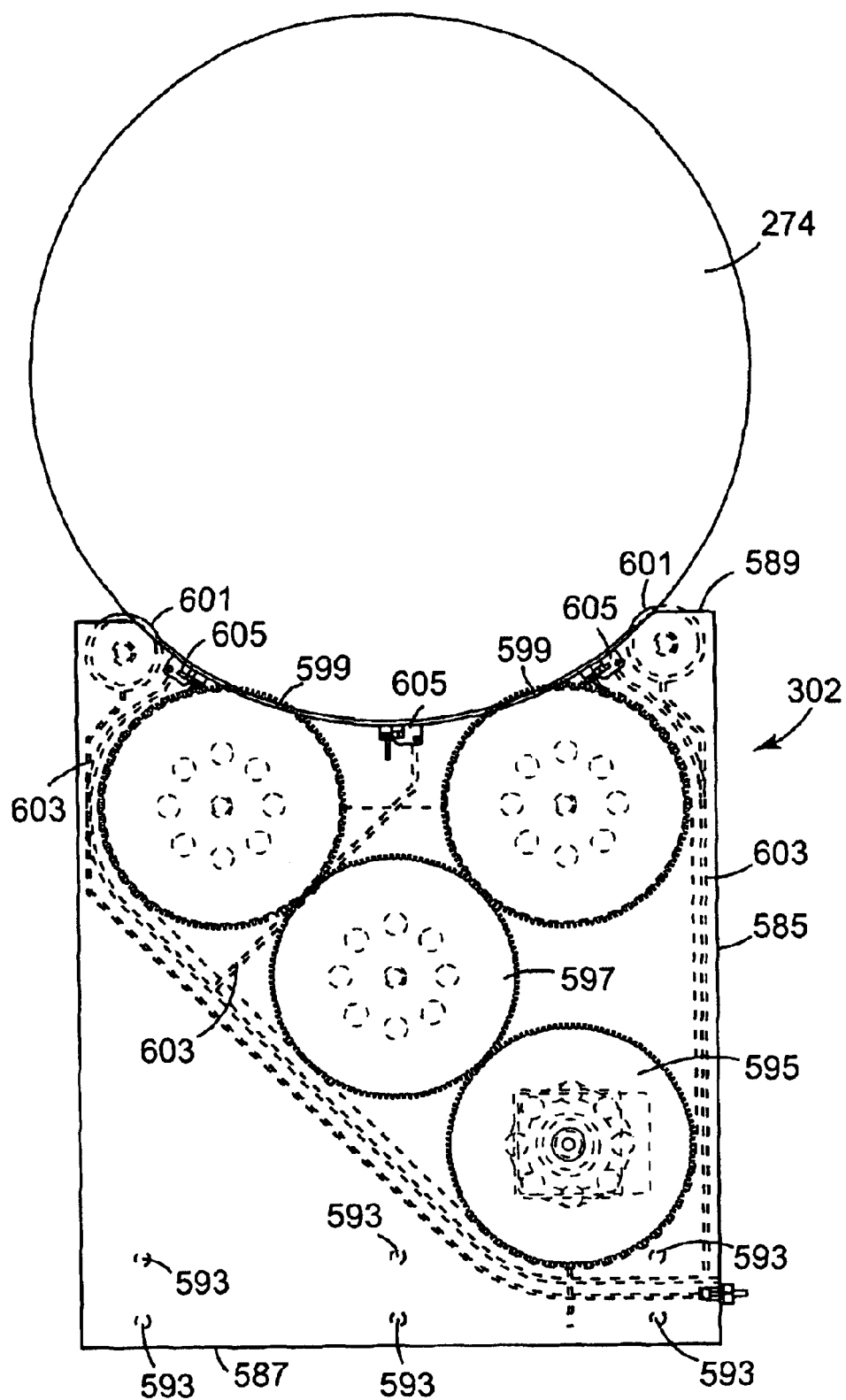
FIG. 18 is a cut-away, side view of a single wafer elevator used in the wafer transfer system of FIG. 15, shown as supporting a substrate.

FIG. 18 is a more detailed view showing the elevator 302 supporting a substrate 374. Elevator 302 generally includes a body 385 including a bottom end 387 and a top end 389. Body 385 includes mounting holes 393 to allow elevator 302 to be coupled to a suitable mechanism that can be used to move elevator 302 in the x, y, and/or z directions as desired. At top end 389, substrate rotating gears 399 and guide rollers 401 frictionally engage a supported edge of substrate 374. Rotation of gears 399 causes corresponding rotation of substrate 374, allowing substrate 374 to be rotated to a desired angular orientation. Motor driven gear 395 is rotationally coupled to substrate rotating gears 399 via idler gear 397. A moderate vacuum is established proximal to gears 399 and rollers 401 through vacuum conduits 405. A vacuum may be established in conduits 405 via vacuum coupling 403 in order to help remove particles that might be generated by engagement between a substrate 374 and elevator 302.

Elevator 302 and/or the elevator mechanism operatively supporting elevator 302 optionally may include sensing capability (not shown) to allow elevator 302 and/or such elevator mechanism also to be used to scan, e.g., map, substrates 374 supported in a wafer holding structure 372 at batching station 373. In such embodiments, the underside of batched substrates 374 could be easily scanned and mapped. Elevator 302 may be translatable to facilitate such scanning. Such translation capabilities may also be used to move elevator 302 from position to position for purposes of batching and unbatching substrates 374 to and from wafer holding structure 372.

The elevator 302 generally has a range of vertical motion extending from a raised position to a lowered position. In the raised position, a substrate 374 is supported far enough above the wafer holding structure 372 to allow the substrate 374 to be gripped by the end effector 377 of wafer transfer robot 370. In this position, the substrate 374 can be placed onto or taken from the single wafer elevator 302. In the lowered position, a substrate 374 is lowered into a supported position in wafer holding structure 372. To allow the elevator 302 to help handle the next substrate to be placed into (or taken from, as the case may be) wafer holding structure 372, indexing elevator 308 is indexed over to the next position and/or wafer holding structure transfer robot 376 may shift wafer holding structure 372 over enough to bring the elevator 302 into operative alignment with the next substrate position.

In alternative embodiments, multiple elevators 302 may be used in concert or integrated into a single larger elevator system to cooperatively batch and unbatch groups of substrates 374. For example, if end effector 377 is capable of handling groups of substrates 374 at any one time, a corresponding number of elevators 302 or a larger integrated elevator may be present to assist with batching and unbatching those groups. Advantageously, each such elevator 302, or such larger integrated elevator, would be able to independently align a corresponding substrate 372 of a group during batching operations.

A wash station 311 optionally is located in the wafer transfer system 368 to rinse and dry end effectors 377, 382, and/or 300 and/or wafer holding structures 372 in accordance with conventional practices. This can be done in order to remove chemical residues, liquids, particles, or the like before end effectors 377, 382, and/or 300 are used to handle additional substrates 374.

Referring again to FIGS. 10 through 20, collectively, processing zone 384 generally provides a working space in which one or more substrates 374 are subjected to one or more process treatments, typically while being supported in a wafer holding structure 372. For purposes of illustration, processing zone 384 of tool 311 includes three different processing stations 388, 389, and 390, although other embodiments may include lesser or greater numbers of such stations, as desired. Processing stations 388, 389, and 390 are shown as being arranged in linear fashion along the y-axis direction 327, but other orientations may be used. For example, processing stations may be arranged along the x-axis direction 325, stacked in the z-axis direction 331, arranged in a cluster, and/or the like.

Typically, one or more suitable processing zone robots may be used to convey substrates 374 to and from the processing zone 384 and/or among the various process stations 388, 389, and 390. As shown, a single processing zone robot 394 preferably provides these capabilities. Robot 394 preferably is in the form of a multiple axis gantry and includes a y-axis slide 396 that extends along the y-axis direction 327 so that each of processing stations 388, 389, and 390 is within the operational reach of robot 394. Robot 394 includes z-axis slide 398 that is moveable back and forth along the length of y-axis slide 396. End effector 300 is mounted on z-axis slide 398 and can move up and down along the length of the z-axis slide 398 sufficiently to handle batches of substrates 374 in the desired manner. Optionally, end effector 300 may be coupled to z-axis slide 398 on a telescoping, articulating, or other moveable support 312 to allow robot 394 to have x-y-z motion capability. At one end of y-axis slide 396, the z-axis slide 398 is positioned proximal to wafer transfer system 368, or even within wafer transfer system 368 in some embodiments, so that end effector 300 can pick up wafer holding structures 372 for processing or drop off wafer holding structures 372 after processing. In other respective positions along the length of y-axis slide 396, end effector 300 can convey wafer holding structures 372 to and from processing stations 388, 389, and 390 for processing and pick up.

Preferably, a mini-environment is provided over the wafer transfer zone 368 and/or processing zone 384 to maintain a particle free air flow around the wafer batching robot, wafer stacks and the two gantry robots. Optional ionization grids (not shown) may also be used to prevent static charge buildup in accordance with conventional practices.

Tool 311, if desired, may be an assemblage of one or more modules to facilitate service, upgrade, or replacement of portions of tool 311. For example, dotted lines 338 show possible boundaries between optional modular components. In the particular illustrative embodiment shown, one module corresponds to a buffer zone 434, another module corresponds to a wafer transfer system 368, and one or more additional modules constitute a processing zone 384. Each of modular components constituting zones 344, 368, and 384 optionally may be further sub-divided into smaller modular components, if desired, to facilitate service, performance, upgrade, replacement, or the like. For example, processing zone 384 as shown is formed from one or more modular processing stations 388, 389, and 390.

In particular, in order to improve accessibility and maintenance of the components of the wafer transfer system, the two PDOs assemblies, the wafer transfer robot, its controller (not shown), and the furniture sets (e.g., wafer holding structures 372 and shelves 314 to support them) are preferably mounted on one or more respective rollaway, subassemblies 316, e.g., carts, that can easily removed from the tool for service, maintenance, upgrade, and/or replacement. This also provides access to the gantry-like robots 376 and 394 as well as the back of the buffer zone 344. The robot 362 within the buffer zone 344 may also be mounted on a cart(not shown) that can be pulled out through the rear of the buffer zone 344 into the space vacated by the wafer transfer system cart and thereby removed from the tool. Alignment features preferably are provided to help ensure that the carts lock back into the same positions once rolled back into place.

Automatic teach capability (also referred to as automated calibration or autocalibration) can be used to teach the various pick-up and drop-off locations for the buffer zone robot 362, the wafer transfer robot 370, the wafer holding structure transfer robot 376, and/or the process zone robot 394 to automate the tool set-up following assembly or maintenance.

In one representative mode of operation of tool 311 shown in FIGS. 10 through 15, a production line robot (not shown) or worker (not shown) may place a FOUP 341, which may house one or more processable substrates 374, onto one of load ports 335. Robot 362 reaches through the corresponding portal 343 to grip the FOUP 341 and brings the FOUP 341 inside buffer zone 344. In one mode of operation, the robot 362 may transfer the FOUP 341 to an open PDO assembly 354 where the FOUP operatively engages the airlock structure 359 of the PDO assembly 354. The airlock structure 359 is opened, providing egress into the FOUP 341 from inside wafer transfer system 368. In other modes, the FOUP 341 may be stored within buffer zone 344 prior to being transported to a PDO assembly 354.

As best shown by FIG. 15, once a FOUP 341 is engaged with the airlock structure 359, wafer transfer robot 370 transfers substrates 374 from the FOUP 341 to a wafer holding structure 372 positioned at the batching station 373. Substrates 374 may be transferred to the wafer holding structure 372 in batches or one at a time. Preferably, substrates 374 are transferred one at a time. In the case of single wafer transfer, after the wafer transfer robot 370 withdraws a substrate 374, the robot 370 rotates and turns to face the batching station 373. A wrist twist operation is carried out (either clockwise or counterclockwise, as the case may be) to turn the substrate 374 from a horizontal orientation to a vertical one. The robot 370 then places the substrate 374 onto the raised elevator 302 that helps support the vertical substrate 374. The elevator 302 then lowers the substrate 302 into the wafer holding structure 372. The elevator 302 or wafer holding structure 372 may be indexed over to locate the elevator 302 with the next empty position of the wafer holding structure 372 into which another substrate 372 will be placed. The process is continued until the desired number of substrates 374 is transferred to vertical stack held in the wafer holding structure 372 at batching station 373.

Industry standard FOUPs generally can hold up to 25 processable substrates 374. However, each wafer holding structure 372 may be designed with a greater capacity, e.g., some embodiments of wafer holding structures 372 may have the ability to hold 50 or more processable substrates 374 at one time. Accordingly, substrates 374 may be batched or unbatched from such a wafer holding structure 372 to and from one or more FOUPs 341 at one or more of PDO assemblies 354.

Substrates 374 may preferably be placed into the wafer holding structure 372 in a face-to-face and back-to-back order, with the device sides of each substrate 374 only facing the device sides of other substrates 374. This is easily accomplished by twisting the wrested end effector 377 in alternate directions, clockwise and counter clockwise before placing substrates 374 onto the elevator 302. Of course, substrates 374 may also be placed in a standard face-to-back orientation as well.

Robot 370 optionally may add additional dummy wafers 374' to fill and/or cap a supply of batched substrates 374, if desired. Once the transfer from the FOUP(s) 341 to the wafer holding structure 372 is complete, the PDO assembly (ies) 354 is/are closed and disengaged from FOUP 341, and robot 362 stores the empty FOUP(s) 341 at convenient locale(s) inside buffer zone 344.

With the wafer holding structure 372 holding the desired number of substrates 374, the wafer holding structure transport robot 376 picks up the wafer holding structure 372 and may transfer the wafer holding structure 372 either to any of buffer positions 380 and then to the hand off station 383 or directly to the hand off station 383. At the hand off station 383, processing zone robot 394 picks up the batch of substrates 374, removing them from the wafer holding structure 372 and bringing them into processing zone 384 for processing. In the meantime, the now-empty wafer holding structure 372 can be taken from the hand off position 383 and stored in wafer transfer zone 368 until needed, washed in wash station 311, or transferred directly back to the batching station 373 for additional use.

Once the processing of substrates 374 is completed in the desired manner, robot 394 returns the batch of substrates 374 to an empty wafer holding structure 372 waiting at the hand off station 383. Wafer holding structure transport robot 376 may then transfer the processed batch of substrates 374 in the wafer holding structure 372 either to a buffer position 380 and then to the batching station or directly back to the batching station 373. At the batching station 373, wafer transfer robot 370 transfers the wafers back into one or more FOUPs through one or both of PDO assemblies 354. When the unbatching is complete for each such FOUP 341, buffer zone robot 362 transfers the FOUP 341 either to a storage location and then out to a load port 335 for pick up or directly to load port 335 for pick up.

The above mode of operation was described in connection with how one batch of substrates 374 might be handled within tool 311. In actual practice, however, multiple batches will be at different stages of processing within tool 311 in order to more fully utilize the capacity of tool 311. Thus, for instance, at any one time, one batch of substrates might be undergoing loading to and/or from a wafer holding structure 372 at the batching station 373, one or more other batches might be undergoing storage on a shelf 314 or the like within wafer transfer system 368 awaiting further handling or processing, one or more batches may be undergoing storage or handling within buffer zone 344, and/or one or more other batches may be undergoing processing at stations 388, 389, and/or 390.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. An end effector system for manipulating a workpiece comprising a semiconductor wafer, the end effector system comprising:
   an end effector comprising:
   i) a proximal end and a distal end; and
   ii) optical sensor system components comprising a lengthwise light path extending between a first optical sensor system element positioned relatively closer to the proximal end and a second optical sensor system element positioned relatively closer to the distal end.

2. The end effector system of claim 1, wherein the light path intersects an axis along the centerline of the end effector at the distal end of the end effector, wherein the light path and centerline form an angle in the range from 0 degrees to 45 degrees.

3. The end effector system of claim 1, wherein the light path intersects an axis along the centerline of the end effector at the distal end of the end effector, wherein the light path and centerline form an angle in the range from 0 degrees to 30 degrees.

4. The end effector system of claim 1, wherein the light path intersects an axis along the centerline of the end effector at the distal end of the end effector, wherein the light path and centerline form an angle in the range from 0 degrees to 10 degrees.

5. The end effector system of claim 1, wherein the first optical sensor system element comprises an optical light source fiber and the second optical sensor system element comprises an optical light receiver fiber, wherein the source and receiver fibers are housed within the end effector.

6. The end effector system of claim 1, wherein the first and second optical sensor system elements are positioned along a lengthwise edge of the end effector.

7. The end effector system of claim 6, wherein the first and second optical sensor system elements are spaced from the lengthwise edge of the end effector a distance to allow the light path to intersect a portion of a first wafer in a separate holding structure and to prevent the first and second optical sensor system elements from extending beyond a perimeter of a second wafer gripped by the end effector.

8. The end effector system of claim 1, wherein the first and second optical sensor system elements are housed in first and second structures respectively, wherein the first and second structures extend in a direction perpendicular to a longitudinal axis of the end effector.

9. The end effector system of claim 1, wherein the first and second optical sensor system elements and light path lie within a main plane the end effector.

10. The end effector system of claim 1, wherein the light path intersects an axis along the centerline of the end effector at the distal end of the end effector, wherein the light path and centerline form an angle in the range from 0 degrees to 90 degrees.

11. The end effector system of claim 1, wherein the end effector is coupled to a robotic arm, wherein the end effector and robotic arm form part of a robotic system for manipulating a workpiece comprising a semiconductor wafer.

12. The end effector system of claim 11, wherein the robotic system forms part of a tool for manipulating a workpiece comprising a semiconductor wafer.

13. The end effector system of claim 1, wherein the end effector comprises a range of motion such that the end effector is independently movable about at least a first axis.

14. The end effector system of claim 13, wherein the end effector comprises a range of motion such that the end effector is independently rotatable about an axis along the centerline of the end effector.

15. A method of mapping a wafer holding structure, comprising the steps of:
   a) providing an end effector system comprising:
      i) an end effector comprising:
         a) a proximal end and a distal end; and
         b) optical sensor system components comprising a lengthwise light path extending between a first optical sensor system element positioned relatively closer to the proximal end and a second optical sensor system element positioned relatively closer to the distal end; and
   b) causing the end effector system to use the optical sensor system components to mappingly scan the holding structure, wherein the holding structure optionally stores one or more wafers.

16. The method of claim 11, wherein:
   a) the first and second optical sensor system elements are positioned along a lengthwise edge of the end effector; and
   b) the step of causing the robot to use the optical sensor system to mappingly scan the holding structure comprises the steps of:
      i) positioning the lengthwise edge of the end effector that includes the first and second optical sensor system elements in a scanning position proximal the wafer holding structure; and
      ii) moving the end effector along an axis perpendicular to the plane of the one or more wafers so that the one or more wafers can interrupt the light path.

17. The method of claim 16, wherein a main plane of the one or more wafers is a vertical orientation.

18. The method of claim 17, wherein the lengthwise edge of the end effector that includes the first and second optical sensor system elements is positioned above the one or more wafers.

19. The method of claim 18, wherein the wafer holding structure is positioned in a structure such that a headspace is defined, the headspace having a height distance value less that a length value of a main plane of the end effector and greater that a width value of the main plane of the end effector.

20. A method of calibrating a robotic system, comprising the steps of:
   a) providing an end effector system comprising:
      i) an end effector comprising:
         a) a proximal end and a distal end; and
         b) optical sensor system components comprising a lengthwise light path extending between a first optical sensor system element positioned relatively closer to the proximal end and a second optical sensor system element positioned relatively closer to the distal end;
   b) causing the end effector system to use the optical sensor system components to obtain information relating to an environment within the operational reach of the end effector system; and
   c) using at least a portion of the information to calibrate the end effector system.

21. The method of claim 20, wherein:
   a) the first and second optical sensor system elements are positioned along a lengthwise edge of the end effector; and
   b) the step of causing the end effector system to use the optical sensor system components to obtain information relating to an environment within the operational reach of the end effector system comprises the steps of:
      i) positioning the lengthwise edge of the end effector that includes the first and second optical sensor system elements in a position proximal to a first structure in the environment within the operational reach of the end effector system; and
      ii) moving the end effector along an axis so that the first structure can interrupt the light path.

22. The method of claim 21, wherein the lengthwise edge of the end effector that includes the first and second optical sensor system elements is positioned above the first structure.

23. The method of claim 22, wherein the first structure is positioned within a second structure such that a headspace is defined, the headspace having a height distance value less that a length value of a main plane of the end effector and greater that a width value of the main plane of the end effector.

* * * * *

UNITED STATES PATENT AND TRADEMARK OFFICE
CERTIFICATE OF CORRECTION

PATENT NO. : 6,822,413 B2
DATED : November 23, 2004
INVENTOR(S) : Sean D. Simondet It is certified that error appears in the above-identified patent and that said Letters Patent is hereby corrected as shown below:

Column 21,
Line 3, delete "plane the" and insert in place thereof -- plane of the --.
Line 38, delete "11" and insert in place thereof -- 15 --.
Line 42, delete "robot" and insert in place thereof -- end effector system --.
Line 43, delete "system to" and insert in place thereof -- system components to --.

Column 22,
Lines 8, 9, 50 and 51, delete "that" and insert in place thereof -- than --.

Signed and Sealed this

Third Day of May, 2005

JON W. DUDAS
*Director of the United States Patent and Trademark Office*